United States Patent
Yoon et al.

(10) Patent No.: US 9,935,156 B2
(45) Date of Patent: Apr. 3, 2018

(54) DISPLAY DEVICE HAVING SUB-PIXEL ARRAY STRUCTURE

(71) Applicant: LG Display Co., Ltd., Seoul (KR)

(72) Inventors: Jae-Kyeong Yoon, Goyang-si (KR); Sang-Pyo Hong, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/136,698

(22) Filed: Apr. 22, 2016

(65) Prior Publication Data

US 2016/0315127 A1 Oct. 27, 2016

(30) Foreign Application Priority Data

Apr. 24, 2015 (KR) .................. 10-2015-0057786

(51) Int. Cl.
*H01L 27/32* (2006.01)
*G02F 1/1343* (2006.01)

(52) U.S. Cl.
CPC .... *H01L 27/3218* (2013.01); *G02F 1/134309* (2013.01); *H01L 27/3213* (2013.01); *H01L 27/3216* (2013.01); *H01L 27/3276* (2013.01); *G02F 2001/134345* (2013.01); *G02F 2201/52* (2013.01); *G09G 2300/0452* (2013.01)

(58) Field of Classification Search
CPC ........................................ G09G 3/20
See application file for complete search history.

(56) References Cited

U.S. PATENT DOCUMENTS

2012/0092238 A1* 4/2012 Hwang .................. G09G 3/20
345/55

* cited by examiner

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

A display device is discussed. The display device according to an embodiment includes a substrate including a plurality of gate lines, and a plurality of data lines crossing the plurality of gate lines; and a sub-pixel array structure including a sub-pixel group corresponding to the substrate. The sub-pixel group includes a first sub-pixel; a second sub-pixel in a column different from the first sub-pixel; and third sub-pixels divided in two rows and in two columns with at least one of the first sub-pixel and the second sub-pixel therebetween.

8 Claims, 14 Drawing Sheets

100e

100f

800

805'

DISPLAY DEVICE HAVING SUB-PIXEL ARRAY STRUCTURE

The present application claims the priority benefit of Korean Patent Application No. 10-2015-0057786 filed in Republic of Korea on Apr. 24, 2015, which is hereby incorporated by reference in its entirety for all purposes as if fully set forth herein.

BACKGROUND OF THE INVENTION

Field of the Invention

The present invention relates to a display device. In particular, the present invention relates to a display device having a sub-pixel array structure which can have a high resolution and improve an aperture ratio.

Discussion of the Related Art

An organic light emitting diode display (OLED) device displays images using organic light emitting diodes as self-luminescent elements. An OLED device is a next generation display device having excellent brightness and color purity.

The OLED device includes a plurality of sub-pixel groups using red, green and blue sub-pixels and displays various color images. The red, green and blue sub-pixels can be arranged in various types of sub-pixel array structures including a stripe type, a mosaic type, and a delta type.

Sub-pixels arranged in the stripe type include same color sub-pixels arranged in the same column. Sub-pixels arranged in the mosaic type include red, green and blue sub-pixels arranged alternately in a row direction and a column direction. Sub-pixels arranged in the delta type include red, green and blue sub-pixels arranged alternately in a zigzag form.

FIG. 1 is a view illustrating a sub-pixel array structure including a sub-pixel group including first to third sub-pixels according to the related art. Referring to FIG. 1, a sub-pixel array structure 10 includes sub-pixel groups 15 including a first sub-pixel 11 positioned on a first column, a second sub-pixel 12 on a third column and a third sub-pixel 13 positioned on a second column. The sub-pixel groups 15 are arranged in two columns and two rows.

The first sub-pixel 11 emits red (R) light, the second sub-pixel 12 emits blue (B) light, and the third sub-pixel 13 emits green (G) light. The first to third sub-pixels 11 to 13 are included in one pixel. The first to third sub-pixels have the same area. A driving portion to operate each of the first to third sub-pixels 11 to 13 is located in each of the first to third sub-pixels 11 to 13. The driving portion occupies a certain area of each sub-pixel.

FIG. 2 is a view illustrating a sub-pixel array structure achieving a high resolution by increasing a number of first to third sub-pixels included in a sub-pixel group of FIG. 1 by four times according to the related art. Referring to FIG. 2, the sub-pixel array structure 20 includes sub-pixel groups 25, each including a first sub-pixel 21 positioned in a first column, a second sub-pixel 22 positioned in a third column and a third sub-pixel 23 positioned in a second column. The sub-pixel groups 25 are arranged in four columns and four rows. The sub-pixel array structure 20 of FIG. 2 is four times the number of sub-pixel groups of the sub-pixel array structure 10 of FIG. 1.

The first sub-pixel 21 emits red (R) light, the second sub-pixel 22 emits blue (B) light, and the third sub-pixel 23 emits green (G) light. The first to third sub-pixels 21 to 23 include one pixel. The first to third sub-pixels have the same area. The driving portion to operate each of the first to third sub-pixels 21 to 23 is located in each of the first to third sub-pixels 21 to 23. Each of the first to third sub-pixels 21 to 23 has a quarter of an area of each of the first to third sub-pixels 11 to 13 of FIG. 1. Because an amount of reduction in an area of the driving portion is limited, an aperture ratio of the sub-pixel array structure 20 having a high resolution is greatly reduced. To increase a level of brightness in order to compensate for the reduced aperture ratio, a power consumption increases.

SUMMARY OF THE INVENTION

Accordingly, the present invention is directed to a display device that substantially obviates one or more of the problems due to limitations and disadvantages of the related art. An object of the present invention is to achieve a high resolution, improve an aperture ratio, and reduce a power consumption.

Additional features and advantages of the invention will be set forth in the description which follows, and in part will be apparent from the description, or may be learned by practice of the invention. The advantages of the invention will be realized and attained by the structure particularly pointed out in the written description and claims as well as the appended drawings.

To achieve these and other advantages, and in accordance with the purpose of the present invention, as embodied and broadly described herein, a display device has a sub-pixel array structure that includes a sub-pixel group, the sub-pixel group including a first sub-pixel, a second sub-pixel in a column different from the first sub-pixel, and third sub-pixels which are divided in two rows and in two columns with the first sub-pixel and/or the second sub-pixel therebetween. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
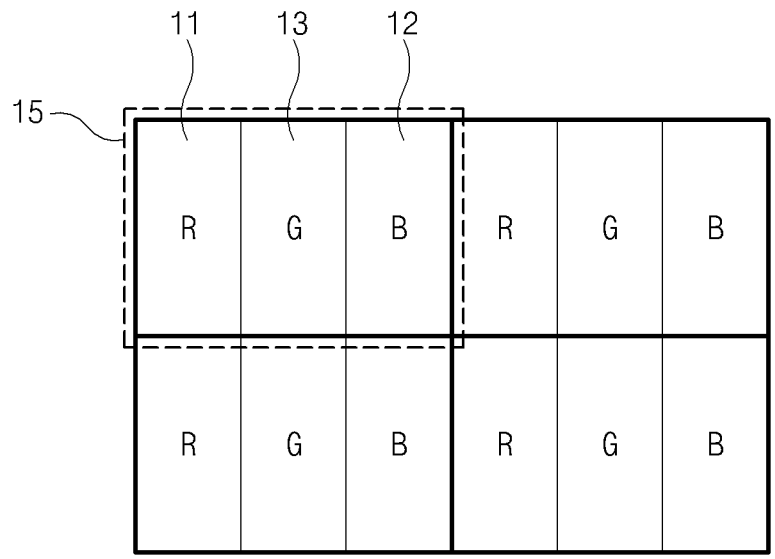
FIG. 1 is a view illustrating a sub-pixel array structure including a sub-pixel group including first to third sub-pixels according to the related art.

Reference will now be made in detail to embodiments, examples of which are illustrated in the accompanying drawings. The same or like reference numbers may be used throughout the drawings to refer to the same or like parts.

FIGS. 3A to 3F are views illustrating sub-pixel array structures according to a first embodiment of the present invention. Sub-pixel array structures 100a to 100f of the first embodiment as illustrated in FIGS. 3A to 3F, respectively, each include a sub-pixel group 105 that includes a first sub-pixel 101, a second sub-pixel 102 positioned on a column different from the first sub-pixel 101, and third sub-pixels 103a to 103d which are divided in two rows and arranged in two columns with the second sub-pixel 102 therebetween.

The first sub-pixel 101 is arranged in a first column. The second sub-pixel 102 is arranged in a third column. The third sub-pixels 103a to 103d are arranged in second and fourth columns. Accordingly, a ratio between numbers of the first, second and third sub-pixels included in each of the sub-pixel array structures 100a and 100f is 1:1:4.

In the sub-pixel group 105 having a predetermined area, an area of the first sub-pixel 101, an area of the second sub-pixel 102, and an area of the third sub-pixels 103a to 103d may be the same. The third sub-pixels 103a to 103d have the same area. In other words, each of the third sub-pixels 103a to 103d has a quarter of the total area of the third sub-pixels 103a to 103d. The first and second sub-pixels 101 and 102 of the sub-pixel group 105 can emit different colors of red (R) and blue (B) light, and the third sub-pixels 103a to 103d of the sub-pixel group 105 can emit green (G) light.

Figure 3A:
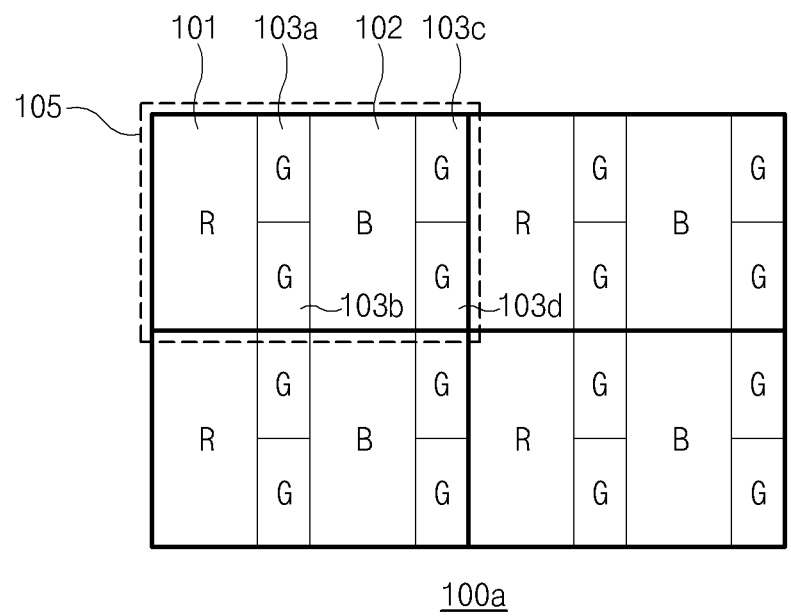
FIGS. 3A to 3F are views illustrating sub-pixel array structures according to a first embodiment of the present invention.
Figure 3B:
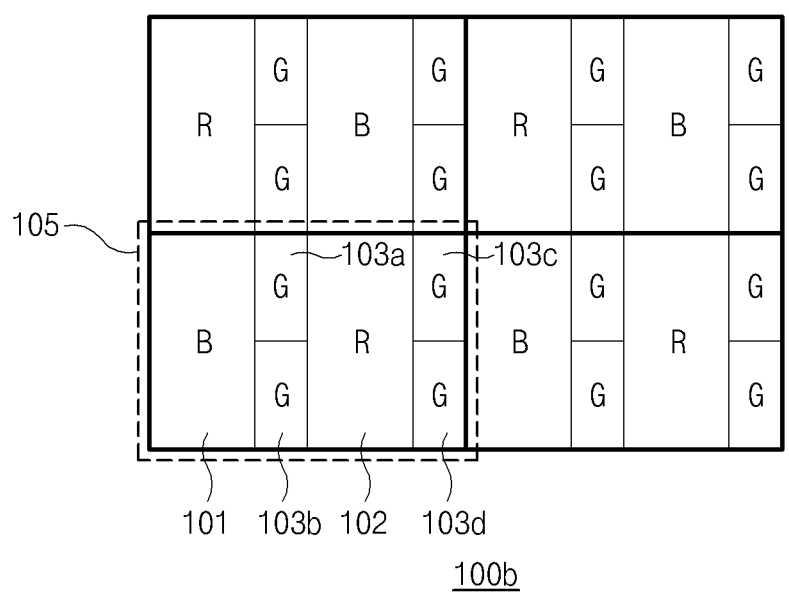

For example, referring to FIG. 3A, the first and second sub-pixels of the sub-pixel group 105 emit red and blue light, respectively, and the third sub-pixels 103a to 103d of the sub-pixel group 105 emit green light. Alternatively, referring to FIG. 3B, the first and second sub-pixels of the sub-pixel group 105 emit blue and red light, respectively, and the third sub-pixels 103a to 103d of the sub-pixel group 105 emit green light.

The sub-pixel array structure 100a of FIG. 3A is a structure including the sub-pixel group 105 arranged repeatedly in each of first and second rows. The sub-pixel array structure 100b of FIG. 3A is a structure including the sub-pixel group 105 of FIG. 3A arranged repeatedly in a first row, and the sub-pixel group 105 of FIG. 3B arranged repeatedly in a second row.

Figure 2:
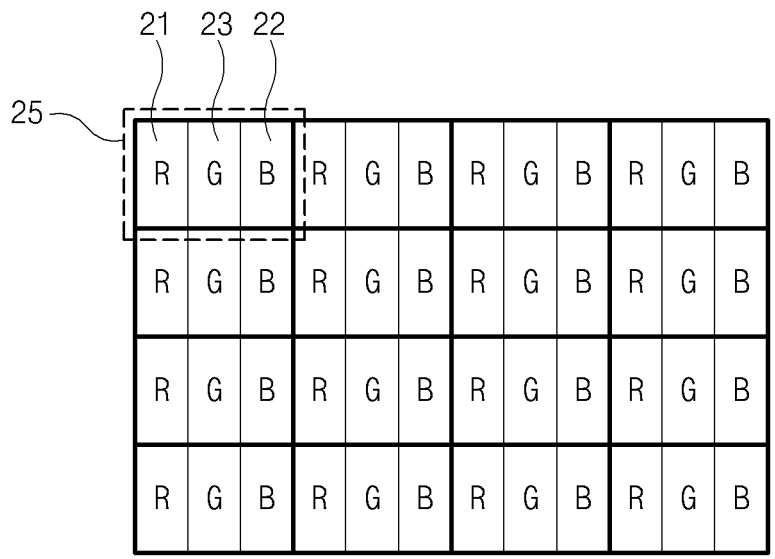
FIG. 2 is a view illustrating a sub-pixel array structure achieving a high resolution by increasing a number of first to third sub-pixels included in a sub-pixel group of FIG. 1 by four times according to the related art.

Accordingly, in the sub-pixel array structures 100a and 100b of the first embodiment, the number of each of the first and second sub-pixels 101 and 102 emitting different colors of light is maintained, the different colors of light including red and blue light. The number of the third sub-pixels 103a to 103d emitting green light of a high cognitive resolution is increased by four times. Thus, compared with the related art sub-pixel array structure 20 (refer to FIG. 2) that achieves a high resolution by increasing the number of each of the first to third sub-pixels 21 to 23 (refer to FIG. 2) by four times, a total number of sub-pixels in the sub-pixel array structures 100a and 100b can be reduced and a high resolution can be achieved as well. The first and second sub-pixels 101 and 102 of the sub-pixel group 105 can emit different colors of red and blue light, and the third sub-pixels 103a to 103d of the sub-pixel group 105 can emit green and white (W) light at a ratio of 1:1.

Figure 3C:
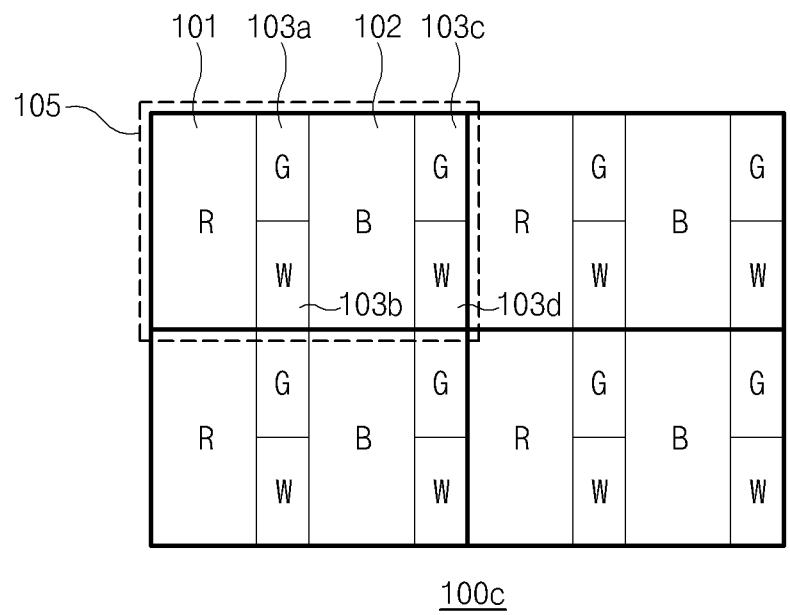

For example, referring to FIG. 3C, the first and second sub-pixels of the sub-pixel group 105 emit red and blue light, respectively. The upper third sub-pixels on an upper row and the lower third sub-pixels on a lower row out of the third sub-pixels 103a to 103d of the sub-pixel group 105 emit green and white light, respectively.

Figure 3D:
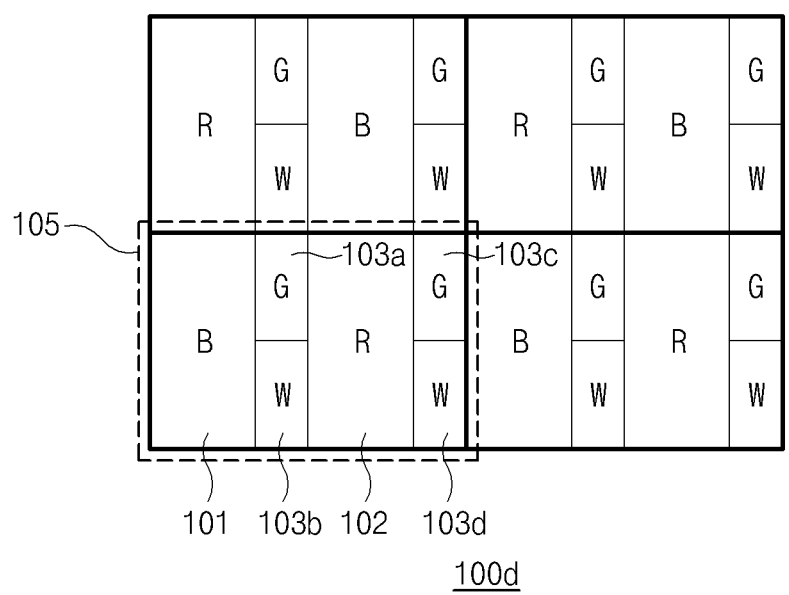

Alternatively, referring to FIG. 3D, the first and second sub-pixels of the sub-pixel group 105 emit blue and red light, respectively. The upper third sub-pixels on an upper row and the lower third sub-pixels on a lower row out of the third sub-pixels 103a to 103d of the sub-pixel group 105 emit green and white light, respectively.

Figure 3E:
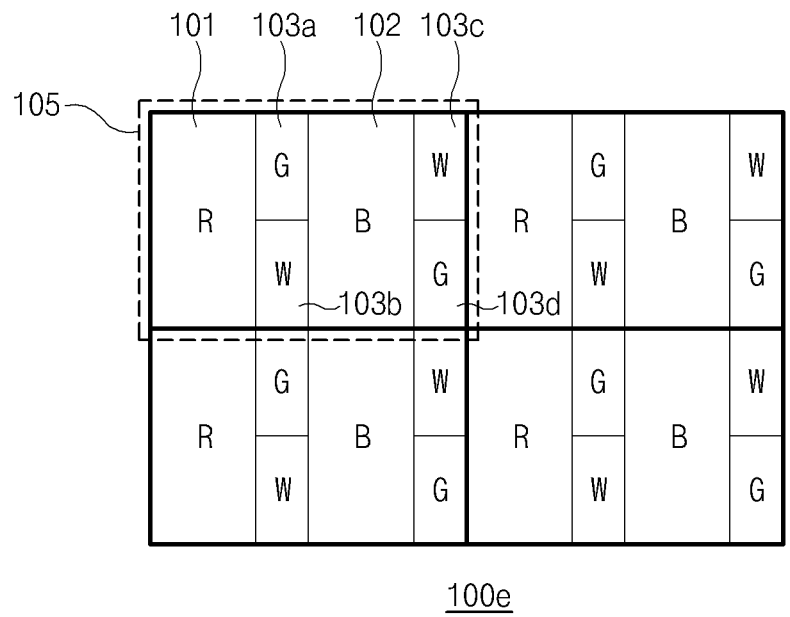

Alternatively, referring to FIG. 3E, the first and second sub-pixels of the sub-pixel group 105 emit red and blue light, respectively. Out of the third sub-pixels 103a to 103d of the sub-pixel group 105, the upper and lower third sub-pixels 103a and 103b on a second column emit green and white light, respectively, and the upper and lower third sub-pixels 103c and 103d on a fourth column emit white and green light, respectively.

Figure 3F:
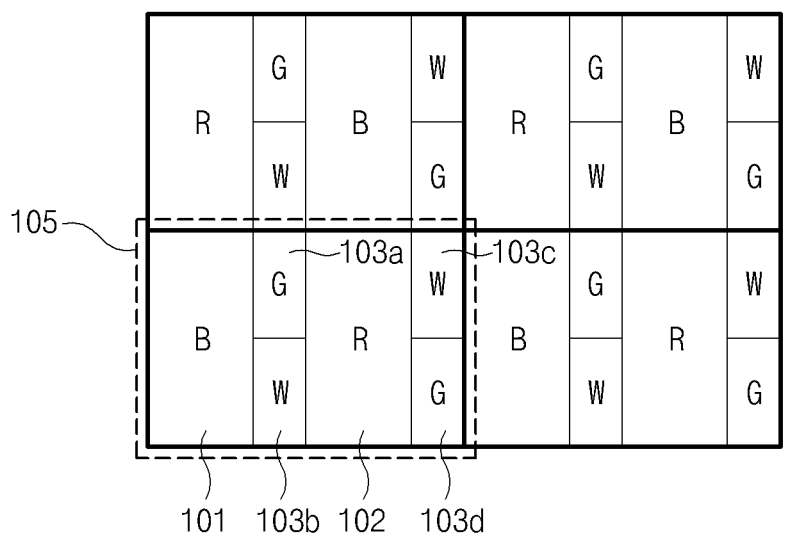

Alternatively, referring to FIG. 3F, the first and second sub-pixels of the sub-pixel group 105 emit blue and red light, respectively. Out of the third sub-pixels 103a to 103d of the sub-pixel group 105, the upper and lower third sub-pixels 103a and 103b on a second column emit green and white light, respectively, and the upper and lower third sub-pixels 103c and 103d on a fourth column emit white and green light, respectively.

The sub-pixel array structure 100c of FIG. 3C is a structure including the sub-pixel group 105 arranged repeatedly in each of first and second rows. The sub-pixel array structure 100d of FIG. 3D is a structure including the sub-pixel group 105 of FIG. 3C arranged repeatedly in a first row, and the sub-pixel group 105 of FIG. 3D arranged repeatedly in a second row. The sub-pixel array structure 100e of FIG. 3E is a structure including the sub-pixel group 105 arranged repeatedly in each of first and second rows. The sub-pixel array structure 100f of FIG. 3F is a structure including the sub-pixel group 105 of FIG. 3E arranged repeatedly in a first row, and the sub-pixel group 105 of FIG. 3F arranged repeatedly in a second row.

Accordingly, in the sub-pixel array structures 100c to 100f of the first embodiment, the number of each of the first and second sub-pixels 101 and 102 emitting different colors of light is maintained, the different colors of light including red and blue lights. The number of the third sub-pixels 103a to 103d emitting green light of a high cognitive resolution and white light improving a brightness at a ratio of 1:1 is increased by four times. Thus, compared with the related art sub-pixel array structure 20 (refer to FIG. 2) that achieves a high resolution by increasing the number of each of the first to third sub-pixels 21 to 23 (refer FIG. 2) by four times, in the embodiments of the present invention a total number of sub-pixels can be reduced, a high resolution can be achieved, and a power consumption can be reduced by improvement of light efficiency.

Each of the first sub-pixel 101 on a first column and the third sub-pixel 102 on a third column also can be divided in two rows. An upper sub-pixel and a lower sub-pixel out of the divided first sub-pixels can emit red and white light, respectively, and an upper sub-pixel and a lower sub-pixel out of the divided second sub-pixels can emit blue and white light, respectively.

Figure 4:
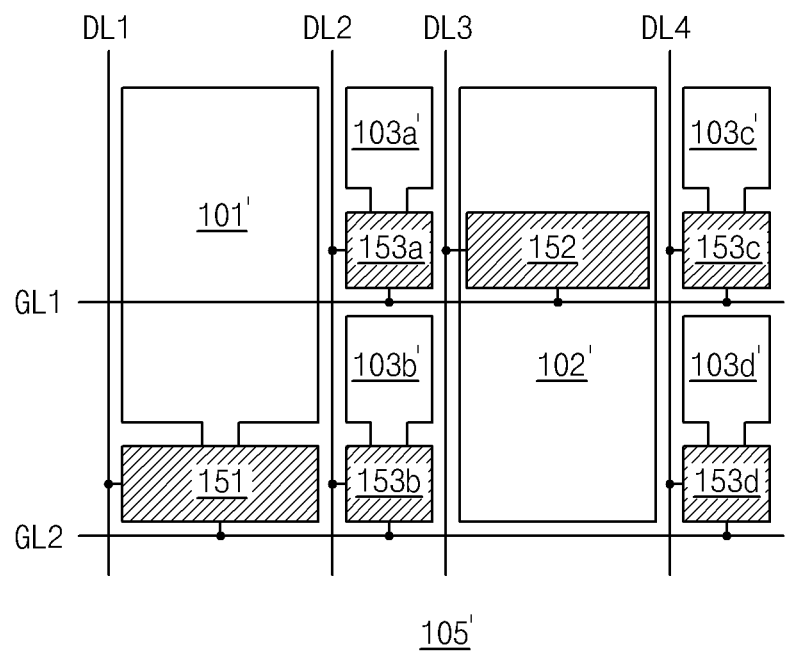
FIG. 4 is a view illustrating a substrate corresponding to one of the sub-pixel groups of FIGS. 3A to 3F.

FIG. 4 is a view illustrating a substrate corresponding to one of the sub-pixel groups in the sub-pixel array structures 100a to 100f of FIGS. 3A to 3F, respectively. The display device may be a light emitting diode display device (OLED) or a liquid crystal display device (LCD), and includes a substrate 105' corresponding to one of the sub-pixel groups 105 of FIGS. 3A to 3F. Referring to FIG. 4, the substrate 105' includes first and second gate lines GL1 and GL2, first to fourth data lines DL1 to DL4, first to sixth pixel electrodes 101', 102', 103a', 103b', 103c', and 103d', and first to sixth driving portions 151, 152, 153a, 153b, 153c, and 153d.

The first and second gate lines GL1 and GL2 on the substrate 105' are along a first direction. The first to fourth data lines DL1 to DL4 are along a second direction crossing the first direction.

The first pixel electrode 101' is located at a region corresponding to the first sub-pixel 101 and positioned at the first gate line GL1 and between the first and second data lines DL1 and DL2. The second pixel electrode 102' is located at a region corresponding to the second sub-pixel 102 and positioned at the first gate line GL1 and between the third and fourth data lines DL3 and DL4. The third to sixth pixel electrodes 103a' to 103d' are located at regions corresponding to the respective third sub-pixels 103a to 103d, the third pixel electrode 103a' positioned adjacent to the first gate line GL1 and between the second and third data lines DL2 and DL3, the fourth pixel electrode 103b' positioned between the first and second gate lines GL1 and GL2 (or positioned adjacent to the second gate line GL2) and between the second and third data lines DL2 and DL3, the fifth pixel electrode 103c' positioned adjacent to the first gate line GL1 and adjacent to the fourth data line DL4, the sixth pixel electrode 103d' positioned between the first and second gate lines GL1 and GL2 (or positioned adjacent to the second gate line GL2) and adjacent to the fourth data line DL4.

The first driving portion 151 is connected to the second gate line GL2, the first data line DL1 and the first pixel electrode 101'. The second driving portion 152 is connected to the first gate line GL1, the third data line DL3 and the second pixel electrode 102'. The third driving portion 153a is connected to the first gate line GL1, the second data line DL2 and the third pixel electrode 103a'. The fourth driving portion 153b is connected to the second gate line GL2, the second data line DL2 and the fourth pixel electrode 103b'. The fifth driving portion 153c is connected to the first gate line GL1, the fourth data line DL4 and the fifth pixel electrode 103c'. The sixth driving portion 153d is connected to the second gate line GL2, the fourth data line DL4 and the sixth pixel electrode 103d'.

Alternatively, the second driving portion 152 may be connected to the second gate line GL2, the third data line DL3, and the second pixel electrode 102'. The first to sixth driving portions 151, 152 and 153a to 153d may each include at least one thin film transistor and at least one capacitor. Accordingly, compared with the related art sub-pixel array structure 20 (refer to FIG. 2) that achieves a high resolution by increasing the number of each of the first to third sub-pixels 21 to 23 (refer to FIG. 2), in the embodiments of the present invention a total number of sub-pixels can be reduced, a high resolution can be achieved, and further, a number of driving portions and a number of data lines are reduced. Thus an aperture ratio can increase and a power consumption can be reduced.

A method of driving the sub-pixel array structures 100a to 100f of the first embodiment is explained below. The third to sixth pixel electrodes 103a' to 103d' corresponding to the respective third sub-pixels 103a to 103d are supplied with first to fourth data signals, respectively. The first pixel electrode 101' corresponding to the first sub-pixel 101 is supplied with a first sampling data signal that is an average of four data signals. The second pixel electrode 102' corresponding to the second sub-pixel 102 is supplied with a second sampling data signal that is an average of four data signals.

In detail, when a first gate signal is supplied to the first gate line GL1, the first data signal is supplied to the third pixel electrode 103a' from the second data line DL2 by the third driving portion 153a, the second sampling data signal is supplied to the second pixel electrode 102' from the third data line DL3 by the second driving portion 152, and the third data signal is supplied to the fifth pixel electrode 130c' from the fourth data line DL4 by the fifth driving portion 153c.

Then, when a second gate signal is supplied to the second gate line GL2, the first sampling data signal is supplied to the first pixel electrode 101' from the first data line DL1 by the first driving portion 151, the second data signal is supplied to the fourth pixel electrode 103b' from the second data line DL2 by the fourth driving portion 153b, and the fourth data signal is supplied to the sixth pixel electrode 130d' from the fourth data line DL4 by the sixth driving portion 153d.

Figure 5:
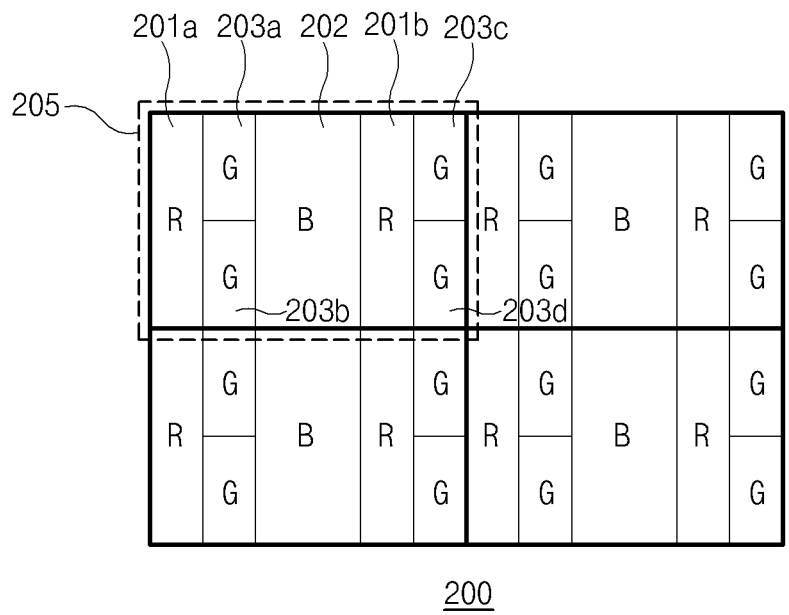
FIG. 5 is a view illustrating a sub-pixel array structure according to a second embodiment of the present invention.

Next, FIG. 5 is a view illustrating a sub-pixel array structure according to a second embodiment of the present invention. A sub-pixel array structure 200 of the second embodiment includes a sub-pixel group 205 including first sub-pixels 201a and 201b, a second sub-pixel 202 positioned on a column different from the first sub-pixels 201a and 201b, and third sub-pixels 203a to 203d which are divided in two rows and arranged in two columns with the first and second sub-pixels 201b and 202 therebetween.

The first sub-pixels 201a and 201b are arranged in first and fourth columns, respectively. The second sub-pixel 202 is arranged in a third column. The third sub-pixels 203a to 203d are arranged in second and fifth columns. Accordingly, a ratio between numbers of the first, second and third sub-pixels included in the sub-pixel array structure 200 is 2:1:4.

In the sub-pixel group 205 having a predetermined area, an area of the first sub-pixels 201a and 201b, an area of the second sub-pixel 202, and an area of the third sub-pixels 203a to 203d may be the same. The first sub-pixels 201a and 201b have the same area. In other words, each of the first sub-pixels 201a and 201b has a half of the total area of the first sub-pixels 201a and 201b. The third sub-pixels 203a to 203d have the same area. In other words, each of the third sub-pixels 203a to 203d has a quarter of the total area of the third sub-pixels 203a to 203d.

The first sub-pixels 201a and 201b, and the second sub-pixel 202 of the sub-pixel group 205 can emit different colors of red (R) and blue (B) light, and the third sub-pixels 203a to 203d of the sub-pixel group 205 can emit green (G) light. Referring to FIG. 5, the first sub-pixels 201a and 201b and the second sub-pixel 202 of the sub-pixel group 205 emit red and blue light, respectively, and the third sub-pixels 203a to 203d of the sub-pixel group 205 emit green light.

The sub-pixel array structure 200 is a structure including the sub-pixel group 205 arranged repeatedly in each of first and second rows. In the sub-pixel array structure 200 of the second embodiment, the number of the second sub-pixels 202 emitting blue light is maintained, the number of the first sub-pixels 201a and 201b emitting red light is increased by two times, and the number of the third sub-pixels 203a to 203d emitting green light of a high cognitive resolution is increased by four times. Thus, compared with the related art sub-pixel array structure 20 (refer to FIG. 2) that achieves a high resolution by increasing the number of each of the first to third sub-pixels 21 to 23 (refer FIG. 2) by four times, in the embodiments of the present invention a total number of sub-pixels can be reduced and a high resolution can be achieved as well.

Figure 6:
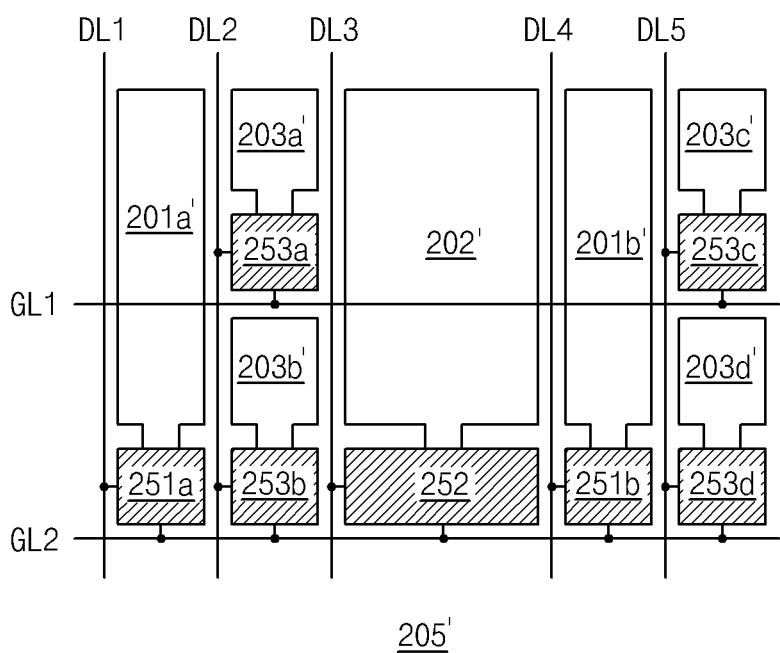
FIG. 6 is a view illustrating a substrate corresponding to the sub-pixel group of FIG. 5.

Next, FIG. 6 is a view illustrating a substrate corresponding to the sub-pixel group of FIG. 5. The display device may be an OLED or an LCD, and includes a substrate 205' corresponding to the sub-pixel group 205 of FIG. 5. Referring to FIG. 6, the substrate 205' includes first and second gate lines GL1 and GL2, first to fifth data lines DL1 to DL5, first to seventh pixel electrodes 201a', 201b', 202', 203a', 203b', 203c', and 203d', and first to seventh driving portions 251a, 251b, 252, 253a, 253b, 253c, and 253d.

The first and second gate lines GL1 and GL2 on the substrate 205' are along a first direction. The first to fifth data lines DL1 to DL5 are along a second direction crossing the first direction.

The first pixel electrode 201a' is located at a region corresponding to the first sub-pixel 201a on a first column, and positioned at the first gate line GL1 and between the first and second data lines DL1 and DL2. The second pixel electrode 201b' is located at a region corresponding to the first sub-pixel 201b on a fourth column, and positioned at the first gate line GL1 and between the fourth and fifth data lines DL4 and DL5. The third pixel electrode 202' is located at a region corresponding to the second sub-pixel 202 and positioned at the first gate line GL1 and between the third and fourth data lines DL3 and DL4. The fourth to seventh pixel electrodes 203a' to 203d' are located at regions corresponding to the respective third sub-pixels 203a to 203d, the fourth pixel electrode 203a' positioned adjacent to the first gate line GL1 and between the second and third data lines DL2 and DL3, the fifth pixel electrode 203b' positioned between the first and second gate lines GL1 and GL2 (or positioned adjacent to the second gate line GL2) and between the second and third data lines DL2 and DL3, the sixth pixel electrode 203c' positioned adjacent to the first gate line GL1 and adjacent to the fifth data line DL5, the seventh pixel electrode 203d' positioned between the first and second gate lines GL1 and GL2 (or positioned adjacent to the second gate line GL2) and adjacent to fifth data line DL5.

The first driving portion 251a is connected to the second gate line GL2, the first data line DL1 and the first pixel electrode 201a'. The second driving portion 251b is connected to the second gate line GL2, the fourth data line DL4 and the second pixel electrode 201b'. The third driving portion 252 is connected to the second gate line GL2, the third data line DL3 and the third pixel electrode 202'. The fourth driving portion 253a is connected to the first gate line GL1, the second data line DL2 and the fourth pixel electrode 203a'. The fifth driving portion 253b is connected to the second gate line GL2, the second data line DL2 and the fifth pixel electrode 203b'. The sixth driving portion 253c is connected to the first gate line GL1, the fifth data line DL5 and the sixth pixel electrode 203c'. The seventh driving portion 253d is connected to the second gate line GL2, the fifth data line DL5 and the seventh pixel electrode 203d'.

Alternatively, the third driving portion 252 may be connected to the first gate line GL1, the third data line DL3, and the third pixel electrode 202'. The first to seventh driving portions 251a, 251b, 252 and 253a to 253d may each include at least one thin film transistor and at least one capacitor.

Accordingly, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced, and a high resolution can be achieved. A number of driving portions and a number of data lines are also reduced thus an aperture ratio can increase and a power consumption can be reduced.

A method of driving the sub-pixel array structure 200 of the second embodiment is explained below. The fourth to seventh pixel electrodes 203a' to 203d' corresponding to the respective third sub-pixels 203a to 203d are supplied with first to fourth data signals, respectively. The first and second pixel electrodes 201a' and 201b' corresponding to the respective first sub-pixels 201a and 201b are supplied with a first sampling data signal that is an average of two data signals and a second sampling data signal that is an average of two data signals, respectively. The third pixel electrode 202' corresponding to the second sub-pixel 202 is supplied with a third sampling data signal that is an average of four data signals.

In detail, when a first gate signal is supplied to the first gate line GL1, the first data signal is supplied to the fourth pixel electrode 203a' from the second data line DL2 by the fourth driving portion 253a, and the third data signal is supplied to the sixth pixel electrode 203c' from the fifth data line DL5 by the sixth driving portion 253c.

Then, when a second gate signal is supplied to the second gate line GL2, the first sampling signal is supplied to the first pixel electrode 201a' from the first data line DL1 by the first driving portion 251a, the second data signal is supplied to the fifth pixel electrode 203b' from the second data line DL2 by the fifth driving portion 253b, the third sampling data signal is supplied to the third pixel electrode 202' from the third data line DL3 by the third driving portion 252, the second sampling data signal is supplied to the second pixel electrode 201b' from the fourth data line DL4 by the second driving portion 251b, and the fourth data signal is supplied to the seventh pixel electrode 203d' from the fifth data line DL5 by the seventh driving portion 253d.

Figure 7A:
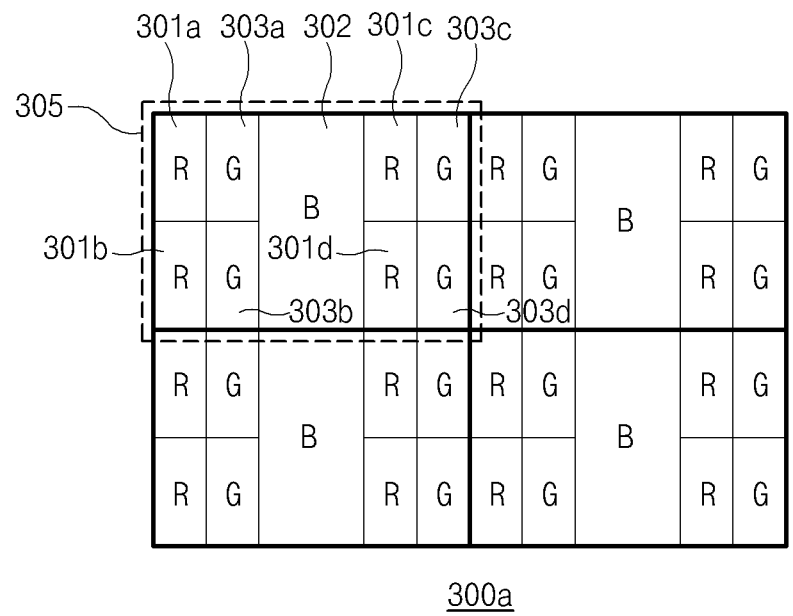
FIGS. 7A and 7B are views illustrating sub-pixel array structures according to a third embodiment of the present invention.
Figure 7B:
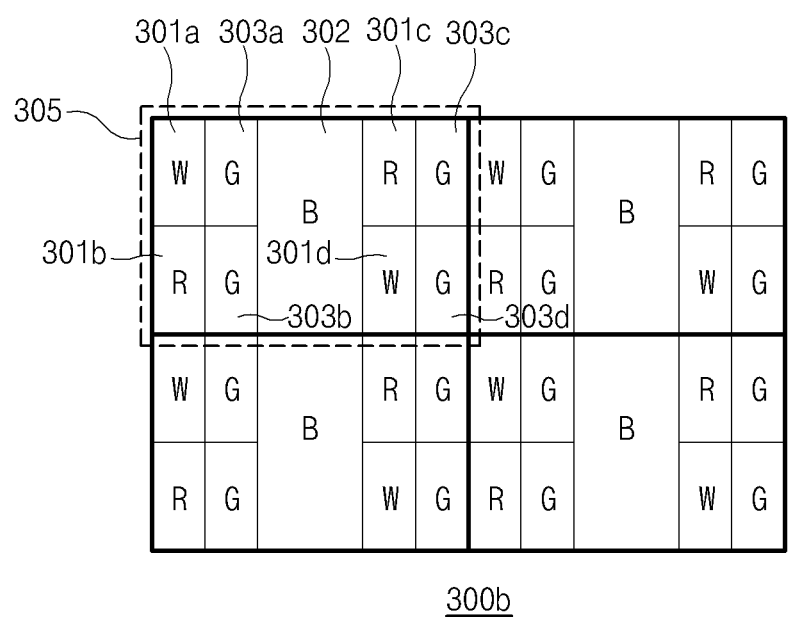

FIGS. 7A and 7B are views illustrating sub-pixel array structures according to a third embodiment of the present invention. Sub-pixel array structures 300a and 300b of the third embodiment include a sub-pixel group 305 including first sub-pixels 301a to 301d, a second sub-pixel 302 positioned on a column different from the first sub-pixels 301a to 301d, and third sub-pixels 303a to 303d which are divided in two rows and arranged in two columns with the first sub-pixels 301c and 301d and the second sub-pixel 302 therebetween.

The first sub-pixels 301a to 301d are divided in two rows and arranged in first and fourth columns, respectively. The second sub-pixel 302 is arranged in a third column. The third sub-pixels 303a to 303d are arranged in second and fifth columns. Accordingly, a ratio between numbers of the first, second and third sub-pixels included in each of the sub-pixel array structures 300a and 300b is 4:1:4.

Further, in the sub-pixel group 305 having a predetermined area, an area of the first sub-pixels 301a to 301d, an area of the second sub-pixel 302, and an area of the third sub-pixels 303a to 303d may be the same. The first sub-pixels 301a to 301d have the same area. In other words, each of the first sub-pixels 301a to 301d has a quarter of the total area of the first sub-pixels 301a to 301d. The third sub-pixels 303a to 303d have the same area. In other words, each of the third sub-pixels 303a to 303d has a quarter of the total area of the third sub-pixels 303a to 303d.

Further, the first sub-pixels 301a to 301d, and the second sub-pixel 302 of the sub-pixel group 305 can emit different colors of light, the different colors of light including red (R) and blue (B) light, and the third sub-pixels 303a to 303d of the sub-pixel group 305 can emit green (G) light. For example, referring to FIG. 7A, the first sub-pixels 301a to 301d and the second sub-pixel 302 of the sub-pixel group 305 emit red and blue light, respectively, and the third sub-pixels 303a to 303d of the sub-pixel group 305 emit green light.

The sub-pixel array structure 300a is a structure including the sub-pixel group 305 arranged repeatedly in each of first and second rows. Accordingly, in the sub-pixel array structure 300a of the third embodiment, the number of the second sub-pixels 302 emitting blue light is maintained, the number of the first sub-pixels 301a to 301d emitting red light increases by four times, and the number of the third sub-pixels 303a to 303d emitting green light of a high cognitive resolution increases by four times. Thus, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced and a high resolution can be achieved as well.

Alternatively, the second sub-pixel 302, and the third sub-pixels 303a to 303d of the sub-pixel group 305 can emit blue and green light, respectively. The first sub-pixels 301a to 301d of the sub-pixel group 305 can emit red and white light at a ratio of 1:1.

For example, referring to FIG. 7B, the second sub-pixel 302, and the third sub-pixels 303a to 303d of the sub-pixel group 305 emit blue and green light, respectively. The upper sub-pixel on an upper row and the lower sub-pixel on a lower row out of the first sub-pixels 301a and 301b on a first column emits white and red light, respectively, and the upper sub-pixel on an upper row and the lower sub-pixel on a lower row out of the first sub-pixels 301c and 301d on a fourth column emits red and white light, respectively.

The sub-pixel array structure 300b is a structure including the sub-pixel group 305 arranged repeatedly in each of first and second rows. Accordingly, in the sub-pixel array structure 300b of the third embodiment, the number of the second sub-pixel 302 emitting blue light is maintained, the number of the third sub-pixels 303a to 303d emitting green light of a high cognitive resolution increases by four times, and the number of the first sub-pixels 301a to 301d emitting red and white light increasing brightness at a ratio of 1:1 increases by four times. Thus, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced, a high resolution can be achieved, and a power consumption by improvement of light efficiency can be reduced as well.

Figure 8:
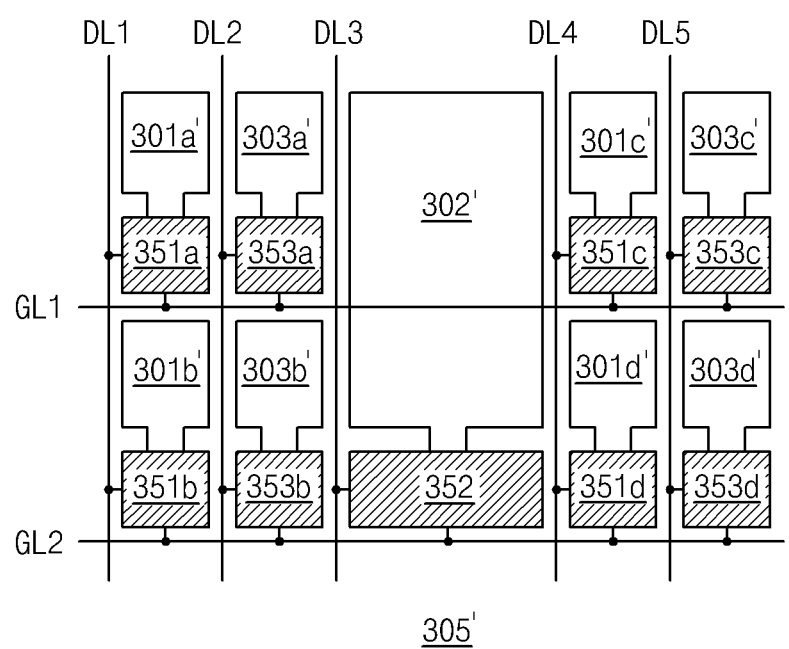
FIG. 8 is a view illustrating a substrate corresponding to one of the sub-pixel groups of FIGS. 7A and 7B.

FIG. 8 is a view illustrating a substrate corresponding to one of the sub-pixel groups of FIGS. 7A and 7B. The display device may be an OLED or an LCD, and includes a substrate 305' corresponding to one of the sub-pixel groups 305 of FIGS. 7A and 7B. Referring to FIG. 8, the substrate 305' includes first and second gate lines GL1 and GL2, first to fifth data lines DL1 to DL5, first to ninth pixel electrodes 301a', 301b', 301c', 301d', 302', 303a', 303b', 303c', and 303d', and first to ninth driving portions 351a, 351b, 351c, 351d, 352, 353a, 353b, 353c, and 353d.

The first and second gate lines GL1 and GL2 on the substrate 305' are along a first direction. The first to fifth data lines DL1 to DL5 are along a second direction crossing the first direction.

The first to fourth pixel electrodes 301a' to 301d' are located at regions corresponding to the respective first sub-pixels 301a to 301d, the first pixel electrode 301a' positioned adjacent to the first gate line GL1 and between the first and second data lines DL1 and DL2, the second pixel electrode 301b' positioned between the first and second gate lines GL1 and GL2 (or positioned adjacent to the second gate line GL2) and between the first and second data lines DL1 and DL2, the third pixel electrode 301c' positioned adjacent to the first gate line GL1 and between the fourth and fifth data lines DL4 and DL5, the fourth pixel electrode 301d' positioned between the first and second gate lines GL1 and GL2 (or positioned adjacent to the second gate line GL2) and between the fourth and fifth data lines DL4 and DL5. The fifth pixel electrode 302' is located at a region corresponding to the second sub-pixel 302 and positioned at the first gate line GL1 and between the third and fourth data lines DL3 and DL4. The sixth to ninth pixel electrodes 303a' to 303d' are located at regions corresponding to the respective third sub-pixels 303a to 303d, the sixth pixel electrode 303a' positioned adjacent to the first gate line GL1 and between the second and third data lines DL2 and DL3, the seventh pixel electrode 303b' between the first and second gate lines GL1 and GL2 (or positioned adjacent to the second gate line GL2) and between the second and third data lines DL2 and DL3, the eighth pixel electrode 303c' positioned adjacent to the first gate line GL1 and adjacent to the fifth data line DL5, the ninth pixel electrode 303d' positioned between the first and second gate lines GL1 and GL2 (or positioned adjacent to the second gate line GL2) and adjacent to the fifth data line DL5.

The first driving portion 351a is connected to the first gate line GL1, the first data line DL1 and the first pixel electrode 301a'. The second driving portion 351b is connected to the second gate line GL2, the first data line DL1 and the second pixel electrode 301b'. The third driving portion 351c is connected to the first gate line GL1, the fourth data line DL4 and the third pixel electrode 301c'. The fourth driving portion 351d is connected to the second gate line GL2, the fourth data line DL4 and the fourth pixel electrode 301d'. The fifth driving portion 352 is connected to the second gate line GL2, the third data line DL3 and the fifth pixel electrode 302'. The sixth driving portion 353a is connected to the first gate line GL1, the second data line DL2 and the sixth pixel electrode 303a'. The seventh driving portion 353b is connected to the second gate line GL2, the second data line DL2 and the seventh pixel electrode 303b'. The eighth driving portion 353c is connected to the first gate line GL1, the fifth data line DL5 and the eighth pixel electrode 303c'. The ninth driving portion 353d is connected to the second gate line GL2, the fifth data line DL5 and the ninth pixel electrode 303d'.

Alternatively, the fifth driving portion 352 may be connected to the first gate line GL1, the third data line DL3, and the fifth pixel electrode 302'. The first to ninth driving portions 351a to 321d, 352 and 353a to 353d may each include at least one thin film transistor and at least one capacitor.

Accordingly, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced, a high resolution can be achieved, and further, a number of driving portions and a number of data lines are reduced thus an aperture ratio can increase and a power consumption can be reduced.

A method of driving the sub-pixel array structures 300a and 300b of the third embodiment is explained below. The first to fourth pixel electrodes 301a' to 301d' corresponding to the respective first sub-pixels 301a to 301d are supplied with first to fourth data signals, respectively. The sixth to ninth pixel electrodes 303a' to 303d' corresponding to the respective third sub-pixels 303a to 303d are supplied with fifth to eighth data signals, respectively. The fifth pixel electrode 302' corresponding to the second sub-pixel 302 is supplied with a first sampling data signal that is an average of four data signals.

In detail, when a first gate signal is supplied to the first gate line GL1, the first data signal is supplied to the first pixel electrode 301a' from the first data line DL1 by the first driving portion 351a, the fifth data signal is supplied to the sixth pixel electrode 303a' from the second data line DL2 by the sixth driving portion 353a, the third data signal is supplied to the third pixel electrode 301c' from the fourth data line DL4 by the third driving portion 351c, and the seventh data signal is supplied to the eighth pixel electrode 303c' from the fifth data line DL5 by the eighth driving portion 353c.

Then, when a second gate signal is supplied to the second gate line GL2, the second data signal is supplied to the second pixel electrode 301b' from the first data line DL1 by the second driving portion 351b, the sixth data signal is supplied to the seventh pixel electrode 303b' from the second data line DL2 by the seventh driving portion 353b, the first sampling data signal is supplied to the fifth pixel electrode 302' from the third data line DL3 by the fifth driving portion 352, the fourth data signal is supplied to the fourth pixel electrode 301d' from the fourth data line DL4 by the fourth driving portion 351d, and the eighth data signal is supplied to the ninth pixel electrode 303d' from the fifth data line DL5 by the ninth driving portion 353d.

Figure 9:
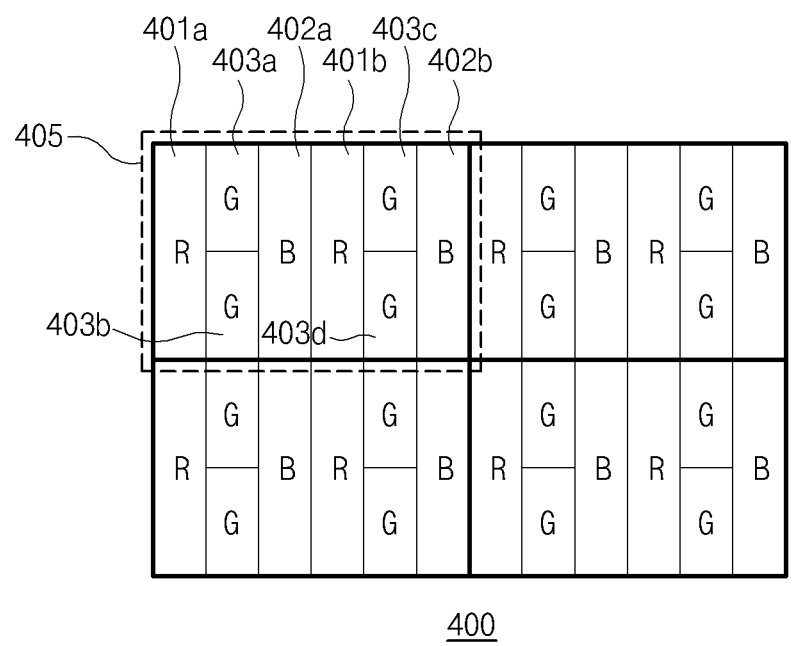
FIG. 9 is a view illustrating a sub-pixel array structure according to a fourth embodiment of the present invention.

FIG. 9 is a view illustrating a sub-pixel array structure according to a fourth embodiment of the present invention. A sub-pixel array structure 400 of the fourth embodiment include a sub-pixel group 405 including first sub-pixels 401a and 401b, second sub-pixels 402a and 402b positioned on columns different from the first sub-pixels 401a and 401b, and third sub-pixels 403a to 403d which are divided in two rows and arranged in two columns with the first sub-pixel 401b and the second sub-pixel 402a therebetween.

The first sub-pixels 401a and 401b are arranged in first and fourth columns, respectively. The second sub-pixels 402a and 402b are arranged in third and sixth columns, respectively. The third sub-pixels 403a to 403d are arranged in second and fifth columns. Accordingly, a ratio between numbers of the first, second and third sub-pixels included in the sub-pixel array structure 400 is 2:2:4.

In the sub-pixel group 405 having a predetermined area, an area of the first sub-pixels 401a and 401b, an area of the second sub-pixels 402a and 402b, and an area of the third sub-pixels 403a to 403d may be the same. The first sub-pixels 401a and 401b have the same area. In other words, each of the first sub-pixels 401a and 401b has a half of the total area of the first sub-pixels 401a and 401b. The second sub-pixels 402a and 402b have the same area. In other words, each of the second sub-pixels 402a and 402b has a half of the total area of the second sub-pixels 402a and 402b. The third sub-pixels 403a to 403d have the same area. In other words, each of the third sub-pixels 403a to 403d has a quarter of the total area of the third sub-pixels 403a to 403d.

Further, the first sub-pixels 401a and 401b, and the second sub-pixels 402a and 402b of the sub-pixel group 405 can emit different colors of red (R) and blue (B) light, and the third sub-pixels 403a to 403d of the sub-pixel group 405 can emit green (G) light. For example, the first sub-pixels 401a and 401b and the second sub-pixels 402a and 402b of the sub-pixel group 405 emit red and blue light, respectively, and the third sub-pixels 403a to 403d of the sub-pixel group 405 emit green light.

The sub-pixel array structure 400 is a structure including the sub-pixel group 405 arranged repeatedly in each of first and second rows. Accordingly, in the sub-pixel array structure 400 of the fourth embodiment, the number of the first sub-pixels 401a and 401b emitting red light increases by two times, the number of the second sub-pixels 402a and 402b emitting blue light increases by two times, and the number of the third sub-pixels 403a to 403d emitting green light of a high cognitive resolution increases by four times. Thus, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced and a high resolution can be achieved as well.

Figure 10:
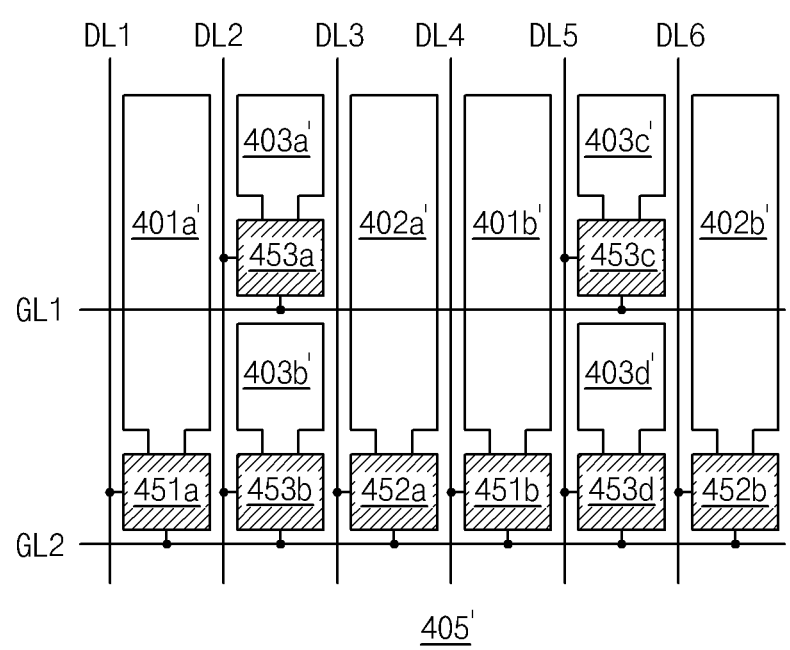
FIG. 10 is a view illustrating a substrate corresponding to the sub-pixel group of FIG. 9.

FIG. 10 is a view illustrating a substrate corresponding to the sub-pixel group of FIG. 9. The display device may be an OLED or an LCD, and includes a substrate 405' corresponding to the sub-pixel group 405 of FIG. 9. Referring to FIG. 10, the substrate 405' includes first and second gate lines GL1 and GL2, first to sixth data lines DL1 to DL6, first to eighth pixel electrodes 401a', 401b', 402a', 402b', 403a', 403b', 403c', and 403d', and first to eighth driving portions 451a, 451b, 452a, 452b, 453a, 453b, 453c, and 453d.

The first and second gate lines GL1 and GL2 on the substrate 405' are along a first direction. The first to sixth data lines DL1 to DL6 are along a second direction crossing the first direction.

The first pixel electrode 401a' is located at a region corresponding to the first sub-pixel 401a on a first column, and positioned at the first gate line GL1 and between the first and second data lines DL1 and DL2. The second pixel electrode 401b' is located at a region corresponding to the first sub-pixel 401b on a fourth column, and positioned at the first gate line GL1 and between the fourth and fifth data lines DL4 and DL5. The third pixel electrode 402a' is located at a region corresponding to the second sub-pixel 402a on a third column, and positioned at the first gate line GL1 and between the third and fourth data lines DL3 and DL4. The fourth pixel electrode 402b' is located at a region corresponding to the second sub-pixel 402b on a six column, and positioned at the first gate line GL1 and adjacent to the sixth data line DL6. The fifth to eighth pixel electrodes 403a' to 403d' are located at regions corresponding to the respective third sub-pixels 403a to 403d, the fifth pixel electrode 403a' positioned at the first gate line GL1 and between the second and third data lines DL2 and DL3, the sixth pixel electrode 403b' positioned between the first and second gate lines GL1 and GL2 (or positioned adjacent to the second gate line GL2) and between the second and third data lines DL2 and DL3, the seventh pixel electrode 403c' positioned adjacent to the first gate line GL1 and between the fifth and sixth data lines DL5 and DL6, the eighth pixel electrode 403d' positioned between the first and second gate lines GL1 and GL2 (or positioned adjacent to the second gate line GL2) and between the fifth and sixth data lines DL5 and DL6.

The first driving portion 451a is connected to the second gate line GL2, the first data line DL1 and the first pixel electrode 401a'. The second driving portion 451b is connected to the second gate line GL2, the fourth data line DL4 and the second pixel electrode 401b'. The third driving portion 452a is connected to the second gate line GL2, the third data line DL3 and the third pixel electrode 402a'. The fourth driving portion 452b is connected to the second gate line GL2, the sixth data line DL6 and the fourth pixel electrode 402b'. The fifth driving portion 453a is connected to the first gate line GL1, the second data line DL2 and the fifth pixel electrode 403a'. The sixth driving portion 453b is connected to the second gate line GL2, the second data line DL2 and the sixth pixel electrode 403b'. The seventh driving portion 453c is connected to the first gate line GL1, the fifth data line DL5 and the seventh pixel electrode 403c'. The eighth driving portion 453d is connected to the second gate line GL2, the fifth data line DL5 and the eighth pixel electrode 403d'.

Alternatively, the third driving portion 452a may be connected to the first gate line GL1, the third data line DL3, and the third pixel electrode 402a', and the fourth driving portion 452b may be connected to the first gate line GL1, the sixth data line DL6, and the fourth pixel electrode 402b'. The first to eighth driving portions 451a, 451b, 452a, 452b and 453a to 453d may each include at least one thin film transistor and at least one capacitor.

Accordingly, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced, a high resolution can be achieved, and further, a number of driving portions and a number of data lines are reduced thus an aperture ratio can increase and a power consumption can be reduced.

A method of driving the sub-pixel array structure 400 of the fourth embodiment is explained below. The fifth to eighth pixel electrodes 403a' to 403d' corresponding to the respective third sub-pixels 403a to 403d are supplied with first to fourth data signals, respectively. The first pixel electrode 401a' corresponding to the first sub-pixel 401a is supplied with a first sampling data signal that is an average of two data signals. The second pixel electrode 401b' corresponding to the first sub-pixel 401b is supplied with a second sampling data signal that is an average of two data signals. The third pixel electrode 402a' corresponding to the second sub-pixel 402a is supplied with a third sampling data signal that is an average of two data signals. The fourth pixel electrode 402b' corresponding to the fourth sub-pixel 402b is supplied with a fourth sampling data signal that is an average of two data signals.

In detail, when a first gate signal is supplied to the first gate line GL1, the first data signal is supplied to the fifth pixel electrode 403a' from the second data line DL2 by the fifth driving portion 453a, and the third data signal is supplied to the seventh pixel electrode 403c' from the fifth data line DL5 by the seventh driving portion 453a.

Then, when a second gate signal is supplied to the second gate line GL2, the first sampling data signal is supplied to the first pixel electrode 401a' from the first data line DL1 by the first driving portion 451a, the second data signal is supplied to the sixth pixel electrode 403b' from the second data line DL2 by the sixth driving portion 453b, the third data signal is supplied to the third pixel electrode 402a' from the third data line DL3 by the third driving portion 452a, the second sampling data signal is supplied to the second pixel electrode 401b' from the fourth data line DL4 by the second driving portion 451b, the fourth data signal is supplied to the eighth pixel electrode 403d' from the fifth data line DL5 by the eighth driving portion 453d, and the fourth sampling data signal is supplied to the fourth pixel electrode 402b' from the sixth data line DL6 by the fourth driving portion 452b.

Figure 11:
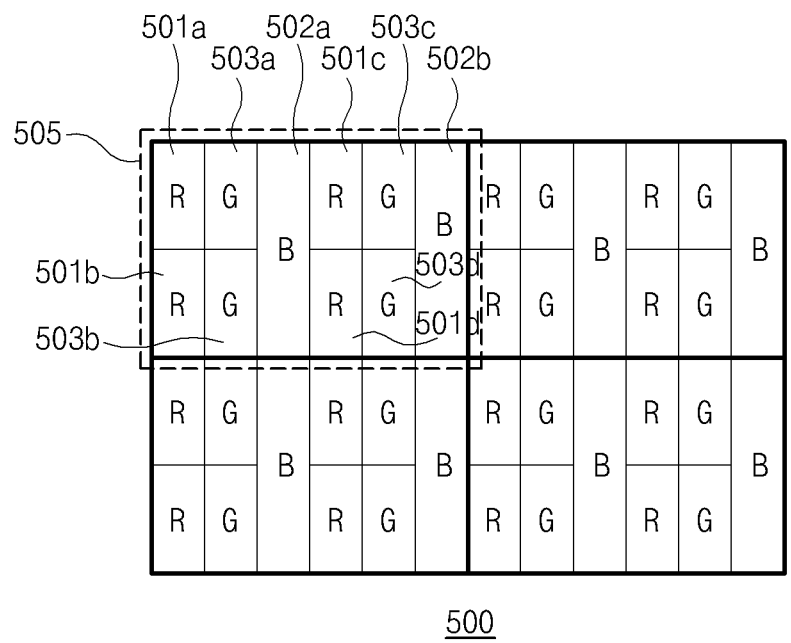
FIG. 11 is a view illustrating a sub-pixel array structure according to a fifth embodiment of the present invention.

FIG. 11 is a view illustrating a sub-pixel array structure according to a fifth embodiment of the present invention. A sub-pixel array structure 500 of the fifth embodiment include a sub-pixel group 505 including first sub-pixels 501a to 501d, second sub-pixels 502a and 502b positioned on columns different from the first sub-pixels 501a to 501d, and third sub-pixels 503a to 503d which are divided in two rows and arranged in two columns with the first sub-pixels 501a to 501d and the second sub-pixel 502a therebetween.

The first sub-pixels 501a to 501d are divided in two rows and arranged in first and fourth columns, respectively. The second sub-pixels 502a and 502b are arranged in third and sixth columns, respectively. The third sub-pixels 503a to 503d are arranged in second and fifth columns. Accordingly, a ratio between numbers of the first, second and third sub-pixels included in the sub-pixel array structure 500 is 4:2:4.

In the sub-pixel group 505 having a predetermined area, an area of the first sub-pixels 501a to 501d, an area of the second sub-pixels 502a and 502b, and an area of the third sub-pixels 503a to 503d may be the same. The first sub-pixels 501a to 501d have the same area. In other words, each of the first sub-pixels 501a to 501d has a quarter of the total area of the first sub-pixels 501a to 501d. The second sub-pixels 502a and 502b have the same area. In other words, each of the second sub-pixels 502a and 502b has a half of the total area of the second sub-pixels 502a and 502b. The third sub-pixels 503a to 503d have the same area. In other words, each of the third sub-pixels 503a to 503d has a quarter of the total area of the third sub-pixels 503a to 503d.

Further, the first sub-pixels 501a to 501d, and the second sub-pixels 502a and 502b of the sub-pixel group 505 can emit different colors of red (R) and blue (B) light, and the third sub-pixels 503a to 503d of the sub-pixel group 505 can emit green (G) light.

For example, the first sub-pixels 501a to 501b and the second sub-pixels 502a and 502b of the sub-pixel group 505 emit red and blue light, respectively. The third sub-pixels 503a to 503d of the sub-pixel group 505 emit green light.

The sub-pixel array structure 500 is a structure including the sub-pixel group 505 arranged repeatedly in each of first and second rows. Accordingly, in the sub-pixel array structure 500 of the fifth embodiment, the number of the first sub-pixels 501a to 501d emitting red light increases by four times, the number of the second sub-pixels 502a and 502b emitting blue light increases by two times, and the number of the third sub-pixels 503a to 503d emitting green light of a high cognitive resolution increases by four times. Thus, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced and a high resolution can be achieved as well.

Figure 12:
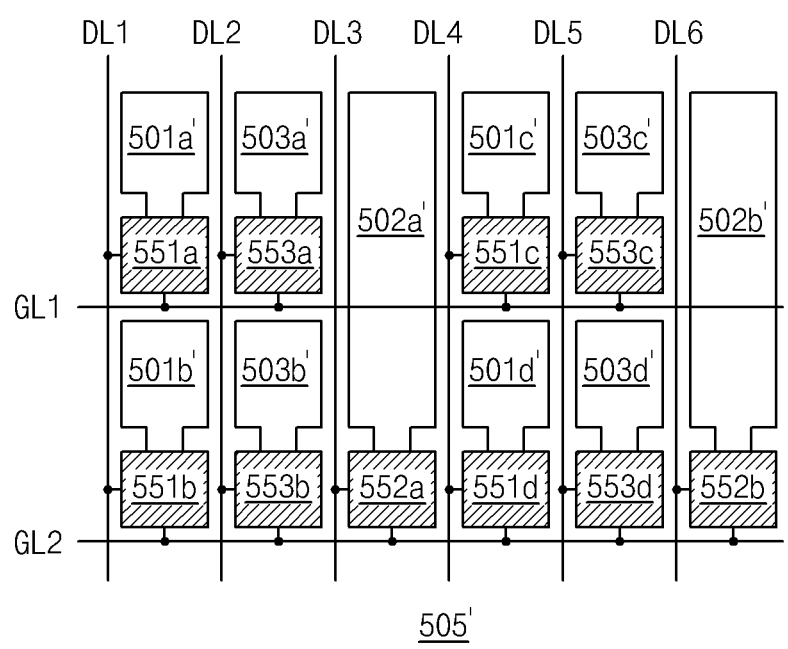
FIG. 12 is a view illustrating a substrate corresponding to the sub-pixel group of FIG. 11.

FIG. 12 is a view illustrating a substrate corresponding to the sub-pixel group of FIG. 11. The display device may be an OLED or an LCD, and includes a substrate 505' corresponding to the sub-pixel group 505 of FIG. 11. Referring to FIG. 12, the substrate 505' includes first and second gate lines GL1 and GL2, first to sixth data lines DL1 to DL6, first to tenth pixel electrodes 501a', 501b', 501c', 501d', 502a', 502b', 503a', 503b', 503c', and 503d', and first to tenth driving portions 551a, 551b, 551c, 551d, 552a, 552b, 553a, 553b, 553c, and 553d.

The first and second gate lines GL1 and GL2 on the substrate 505' are along a first direction. The first to sixth data lines DL1 to DL6 are along a second direction crossing the first direction.

The first to fourth pixel electrodes 501a' to 501d' are located at regions corresponding to the respective first sub-pixels 501a to 501d, the first pixel electrode 501a' positioned adjacent to the first gate line GL1 and between the first and second data lines DL1 and DL2, the second pixel electrode 501b' positioned between the first and second gate lines GL1 and GL2 (or positioned adjacent to the second gate line GL2) and between the first and second data lines DL1 and DL2, the third pixel electrode 501c' positioned adjacent to the first gate line GL1 and between the fourth and fifth data lines DL4 and DL5, the fourth pixel electrode 501d' positioned between the first and second gate lines GL1 and GL2 (or positioned adjacent to the second gate line GL2) and between the fourth and fifth data lines DL4 and DL5. The fifth pixel electrode 502a' is located at a region corresponding to the second sub-pixel 502a on a third column, and positioned at the first gate line GL1 and between the third and fourth data lines DL3 and DL4. The sixth pixel electrode 502b' is located at a region corresponding to the second sub-pixel 502b on a sixth column, and positioned at the first gate line GL1 and adjacent to the sixth data line DL6. The seventh to tenth pixel electrodes 503a' to 503d' are located at regions corresponding to the respective third sub-pixels 503a to 503d, the seventh pixel electrode 503a' positioned adjacent to the first gate line GL1 and between the second and third data lines DL2 and DL3, the eighth pixel electrode 503b' positioned between the first and second gate lines GL1 and GL2 (or positioned adjacent to the second gate line GL2) and between the second and third data lines DL2 and DL3, the ninth pixel electrode 503c' positioned adjacent to the first gate line GL1 and between the fifth and sixth data lines DL5 and DL6, the tenth pixel electrode 503d' positioned between the first and second gate lines GL1 and GL2 (or positioned adjacent to the second gate line GL2) and between the fifth and sixth data lines DL5 and DL6.

The first driving portion 551a is connected to the first gate line GL1, the first data line DL1 and the first pixel electrode 501a'. The second driving portion 551b is connected to the second gate line GL2, the first data line DL1 and the second pixel electrode 501b'. The third driving portion 551c is connected to the first gate line GL1, the fourth data line DL4 and the third pixel electrode 501c'. The fourth driving portion 551d is connected to the second gate line GL2, the fourth data line DL4 and the fourth pixel electrode 501d'. The fifth driving portion 552a is connected to the second gate line GL2, the third data line DL3 and the fifth pixel electrode 502a'. The sixth driving portion 552b is connected to the second gate line GL2, the sixth data line DL6 and the sixth pixel electrode 502b'. The seventh driving portion 553a is connected to the first gate line GL1, the second data line DL2 and the seventh pixel electrode 503a'. The eighth driving portion 553b is connected to the second gate line GL2, the second data line DL2 and the eighth pixel electrode 503b'. The ninth driving portion 553c is connected to the first gate line GL1, the fifth data line DL5 and the ninth pixel electrode 503c'. The tenth driving portion 553d is connected to the second gate line GL2, the fifth data line DL5 and the tenth pixel electrode 503d'.

Alternatively, the fifth driving portion 552a may be connected to the first gate line GL1, the third data line DL3, and the fifth pixel electrode 502a', and the sixth driving portion 552b may be connected to the first gate line GL1, the sixth data line DL6, and the sixth pixel electrode 502b'.

The first to tenth driving portions 551a to 551d, 552a, 552b and 553a to 553d may each include at least one thin film transistor and at least one capacitor. Accordingly, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced, a high resolution can be achieved, and further, a number of driving portions and a number of data lines are reduced thus an aperture ratio can increase and a power consumption can be reduced.

A method of driving the sub-pixel array structure 500 of the fifth embodiment is explained below. The first to fourth pixel electrodes 501a' to 501d' corresponding to the respective first sub-pixels 501a to 501d are supplied with first to fourth data signals, respectively. The fifth pixel electrode 502a' corresponding to the second sub-pixel 502a is supplied with a first sampling data signal that is an average of two data signals. The sixth pixel electrode 502b' corresponding to the second sub-pixel 502b is supplied with a second sampling data signal that is an average of two data signals. The seventh to tenth pixel electrodes 503a' to 503d' corresponding to the respective third sub-pixels 503a to 503d are supplied with fifth to eighth data signals, respectively.

In detail, when a first gate signal is supplied to the first gate line GL1, the first data signal is supplied to the first pixel electrode 501a' from the first data line DL1 by the first driving portion 551a, the fifth data signal is supplied to the seventh pixel electrode 503a' from the second data line DL2 by the seventh driving portion 553a, the third data signal is supplied to the third pixel electrode 501c' from the fourth data line DL4 by the third driving portion 551c, and the seventh data signal is supplied to the ninth pixel electrode 503c' from the fifth data line DL5 by the seventh driving portion 553c.

Then, when a second gate signal is supplied to the second gate line GL2, the second data signal is supplied to the second pixel electrode 501b' from the first data line DL1 by the second driving portion 551b, the sixth data signal is supplied to the eighth pixel electrode 503b' from the second data line DL2 by the eighth driving portion 553b, the first sampling data signal is supplied to the fifth pixel electrode 502a' from the third data line DL3 by the fifth driving portion 552a, the fourth data signal is supplied to the fourth pixel electrode 501d' from the fourth data line DL4 by the fourth driving portion 551d, the eighth data signal is supplied to the tenth pixel electrode 503d' from the fifth data line DL5 by the tenth driving portion 553d, and the second sampling data signal is supplied to the sixth pixel electrode 502b' from the sixth data line DL6 by the sixth driving portion 552b.

Figure 13:
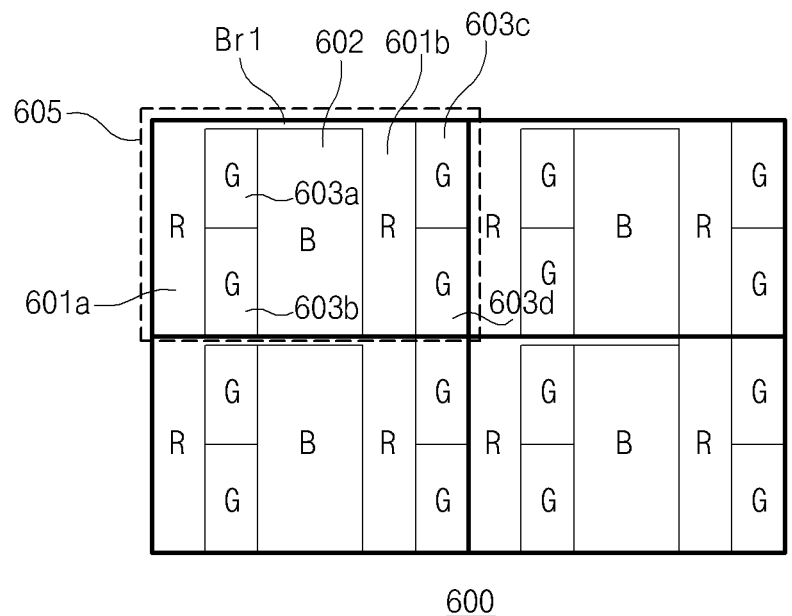
FIG. 13 is a view illustrating a sub-pixel array structure according to a sixth embodiment of the present invention.

FIG. 13 is a view illustrating a sub-pixel array structure according to a sixth embodiment of the present invention. A sub-pixel array structure 600 of the sixth embodiment includes a sub-pixel group 605 including first sub-pixels 601a and 601b, a second sub-pixel 602 positioned on a column different from the first sub-pixels 601a and 601b, and third sub-pixels 603a to 603d which are divided in two rows and arranged in two columns with the first and second sub-pixels 601b and 602 therebetween.

In detail, in a manner different from the second embodiment, the first sub-pixel 601a and 601b is arranged in first and fourth columns, respectively, and portions 601a and 601b of the first sub-pixel are connected to each other through a first bridge Br1. The second sub-pixel 602 is arranged in a third column, and the third sub-pixels 603a to 603d are arranged in second and fifth columns. Accordingly, a ratio between numbers of the first, second and third sub-pixels included in the sub-pixel array structure 600 is 1:1:4.

In the sub-pixel group 605 having a predetermined area, an area of the first sub-pixel 601a and 601b, an area of the second sub-pixel 602, and an area of the third sub-pixels 603a to 603d may be the same. The third sub-pixels 603a to 603d have the same area. In other words, each of the third sub-pixels 603a to 603d has a quarter of the total area of the third sub-pixels 603a to 603d.

Further, the first sub-pixel 601a and 601b, and the second sub-pixel 602 of the sub-pixel group 605 can emit different colors of red (R) and blue (B) light, and the third sub-pixels 603a to 603d of the sub-pixel group 605 can emit green (G) light. For example, the first sub-pixel 601a and 601b and the second sub-pixel 602 of the sub-pixel group 605 emit red and blue light, respectively, and the third sub-pixels 603a to 603d of the sub-pixel group 605 emit green light.

The sub-pixel array structure 600 is a structure including the sub-pixel group 605 arranged repeatedly in each of first and second rows. Accordingly, in the sub-pixel array structure 600 of the sixth embodiment, the number of each of the first sub pixel 601a and 601b and the second sub-pixel 602 emitting red and blue light, respectively, is maintained, and the number of the third sub-pixels 603a to 603d emitting green light of a high cognitive resolution increases by four times. Thus, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced and a high resolution can be achieved as well.

Figure 14:
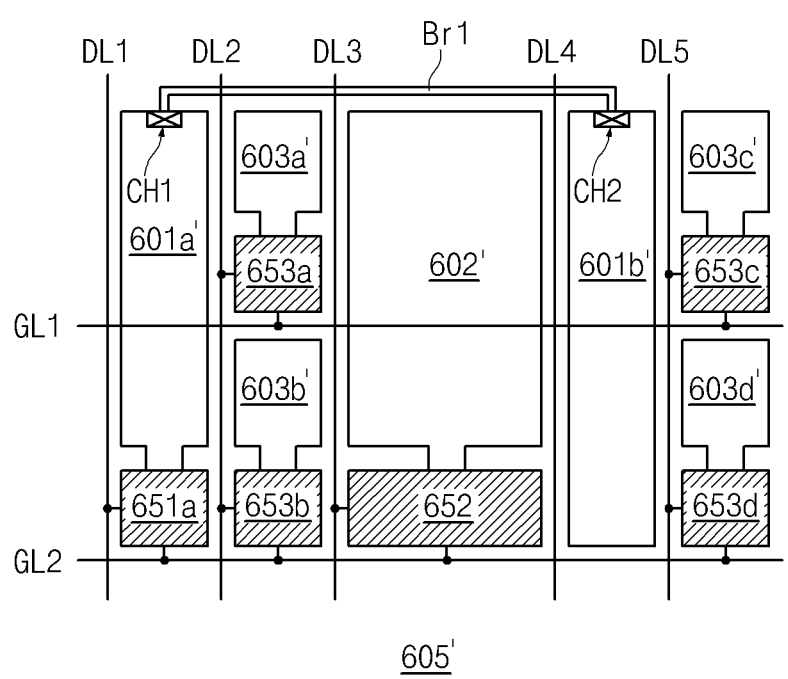
FIG. 14 is a view illustrating a substrate corresponding to the sub-pixel group of FIG. 13.

FIG. 14 is a view illustrating a substrate corresponding to the sub-pixel group of FIG. 13. The display device may be an OLED or an LCD, and includes a substrate 605' corresponding to the sub-pixel group 605 of FIG. 13. The substrate 605' includes first and second gate lines GL1 and GL2, first to fifth data lines DL1 to DL5, first to seventh pixel electrodes 601a', 601b', 602', 603a', 603b', 603c', and 603d', and first to sixth driving portions 651a, 652, 653a, 653b, 653c, and 653d.

The first and second gate lines GL1 and GL2 on the substrate 605' are along a first direction. The first to fifth data lines DL1 to DL5 are along a second direction crossing the first direction.

The first pixel electrode 601a' is located at a region corresponding to the first sub-pixel 601a on a first column, and positioned at the first gate line GL1 and between the first and second data lines DL1 and DL2. The second pixel electrode 601b' is located at a region corresponding to the first sub-pixel 601b on a fourth column, and positioned adjacent to the first gate line GL1 and between the fourth and fifth data lines DL4 and DL5. The third pixel electrode 602' is located at a region corresponding to the second sub-pixel 602 and positioned at the first gate line GL1 and between the third and fourth data lines DL3 and DL4. The fourth to seventh pixel electrodes 603a' to 603d' are located at regions corresponding to the respective third sub-pixels 603a to 603d, the fourth pixel electrode 603a' positioned adjacent to the first gate line GL1 and between the second and third data lines DL2 and DL3, the fifth pixel electrode 603b' positioned between the first and second gate lines GL1 and GL2 (or positioned adjacent to the second gate line GL2) and adjacent to the fifth data line DL5, the sixth pixel electrode 603c' positioned adjacent to the first gate line GL1 and between the second and the third data lines DL2 and DL3, the seventh pixel electrode 603d' positioned between the first and second gate lines GL1 and GL2 (or positioned adjacent to the second gate line GL2) and adjacent to the fifth data line DL5.

The first and second pixel electrodes 601a' and 601b' are connected to each other through the first bridge Br1. The first bridge Br1 is arranged along an upper side edge of the first and second pixel electrodes 601a' and 601b', and is electrically connected to the first and second pixel electrodes 601a' and 601b' through first and second contact holes CH1 and CH2, respectively. The first and second contact holes CH1 and CH2 are formed on the first and second pixel electrodes 601a' and 601b'.

The first driving portion 651a is connected to the second gate line GL2, the first data line DL1 and the first pixel electrode 601a'. The second driving portion 652 is connected to the second gate line GL2, the third data line DL3 and the third pixel electrode 602'. The third driving portion 653a is connected to the first gate line GL1, the second data line DL2 and the fourth pixel electrode 603a'. The fourth driving portion 653b is connected to the second gate line GL2, the second data line DL2 and the fifth pixel electrode 603b'. The fifth driving portion 653c is connected to the first gate line GL1, the fifth data line DL5 and the sixth pixel electrode 603c'. The sixth driving portion 653d is connected to the second gate line GL2, the fifth data line DL5 and the seventh pixel electrode 603d'.

Alternatively, the second driving portion 652 may be connected to the first gate line GL1, the third data line DL3, and the third pixel electrode 602'. The first to sixth driving portions 651a, 652 and 653a to 653d may each include at least one thin film transistor and at least one capacitor.

Accordingly, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced, a high resolution can be achieved. In addition, in the embodiments of the present invention a number of driving portions and a number of data lines are reduced thus an aperture ratio can increase and a power consumption can be reduced.

A method of driving the sub-pixel array structure 600 of the sixth embodiment is explained below. The fourth to seventh pixel electrodes 603a' to 603d' corresponding to the respective third sub-pixels 603a to 603d are supplied with first to fourth data signals, respectively. The first and second pixel electrodes 601a' and 601b' corresponding to the first sub-pixel 601a and 601b and connected to each other through the first bridge Br1 are supplied with a first sampling data signal that is an average of four data signals. The third pixel electrode 602' corresponding to the second sub-pixel 602 is supplied with a second sampling data signal that is an average of four data signals.

In detail, when a first gate signal is supplied to the first gate line GL1, the first data signal is supplied to the fourth pixel electrode 603a' from the second data line DL2 by the third driving portion 653a, and the third data signal is supplied to the sixth pixel electrode 603c' from the fifth data line DL5 by the fifth driving portion 653c.

Then, when a second gate signal is supplied to the second gate line GL2, the first sampling signal is supplied to the first and second pixel electrodes 601a' and 601b' connected to each other through the first bridge Br1 from the first data line DL1 by the first driving portion 651a, the second data signal is supplied to the fifth pixel electrode 503b' from the second data line DL2 by the fourth driving portion 653b, the second sampling data signal is supplied to the third pixel electrode 602' from the third data line DL3 by the second driving portion 652, and the fourth data signal is supplied to the seventh pixel electrode 603d' from the fifth data line DL5 by the sixth driving portion 653d.

Figure 15:
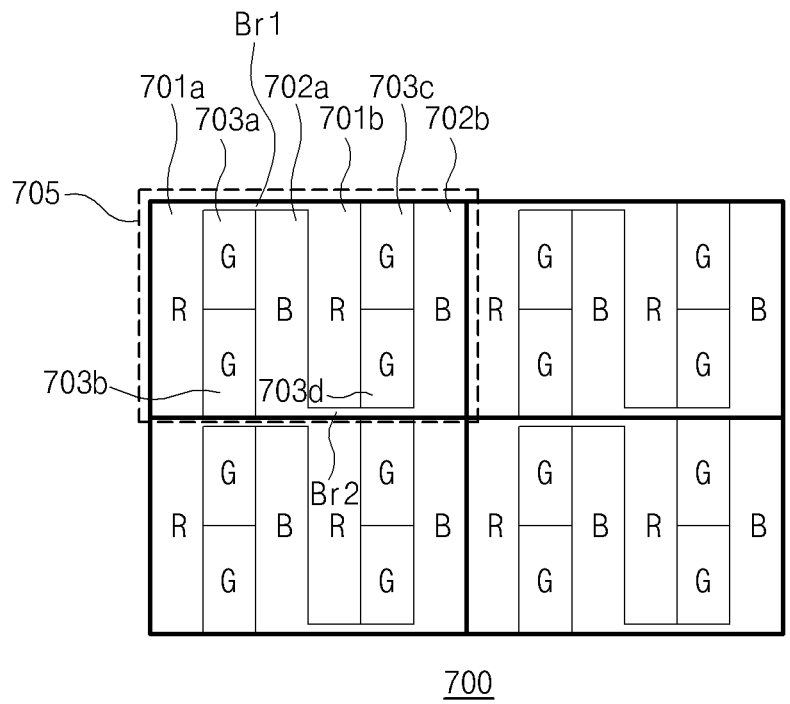
FIG. 15 is a view illustrating a sub-pixel array structure according to a seventh embodiment of the present invention.

FIG. 15 is a view illustrating a sub-pixel array structure according to a seventh embodiment of the present invention. A sub-pixel array structure 700 of the seventh embodiment include a sub-pixel group 705 including a first sub-pixel 701a and 701b, a second sub-pixel 702a and 702b positioned on columns different from the first sub-pixel 701a and 701b, and third sub-pixels 703a to 703d which are divided in two rows and arranged in two columns with the first sub-pixel 701b and the second sub-pixel 702a therebetween.

In detail, in a manner different from the fourth embodiment, the first sub-pixel 701a and 701b is arranged in first and fourth columns, respectively, and portions 701a and 701b of the first sub-pixel are connected to each other through a first bridge Br1. The second sub-pixel 702a and 702b is arranged in third and sixth columns, respectively, and portions 702a and 702b of the second sub-pixel are connected to each other through a second bridge Br2. The third sub-pixels 703a to 703d are arranged in second and fifth columns. Accordingly, a ratio between numbers of the first, second and third sub-pixels included in the sub-pixel array structure 700 is 1:1:4.

In the sub-pixel group 705 having a predetermined area, an area of the first sub-pixel 701a and 701b, an area of the second sub-pixel 702a and 702b, and an area of the third sub-pixels 703a to 703d may be the same. The third sub-pixels 703a to 703d have the same area. In other words, each of the third sub-pixels 703a to 703d has a quarter of the total area of the third sub-pixels 703a to 703d.

Further, the first sub-pixel 701a and 701b, and the second sub-pixel 702a and 702b of the sub-pixel group 705 can emit different colors of red (R) and blue (B) light. The third sub-pixels 703a to 703d of the sub-pixel group 705 can emit green (G) light.

For example, the first sub-pixel 701a and 701b and the second sub-pixel 702a and 702b of the sub-pixel group 705 emit red and blue lights, respectively. The third sub-pixels 703a to 703d of the sub-pixel group 705 emit green light.

The sub-pixel array structure 700 is a structure including the sub-pixel group 705 arranged repeatedly in each of first and second rows. Accordingly, in the sub-pixel array structure 700 of the fourth embodiment, the number of each of the first sub-pixel 701a and 701b emitting red light and the second sub-pixel 702a and 702b emitting blue light is maintained, and the number of the third sub-pixels 703a to 703d emitting green light of a high cognitive resolution increases by four times. Thus, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced and a high resolution can be achieved as well.

Figure 16:
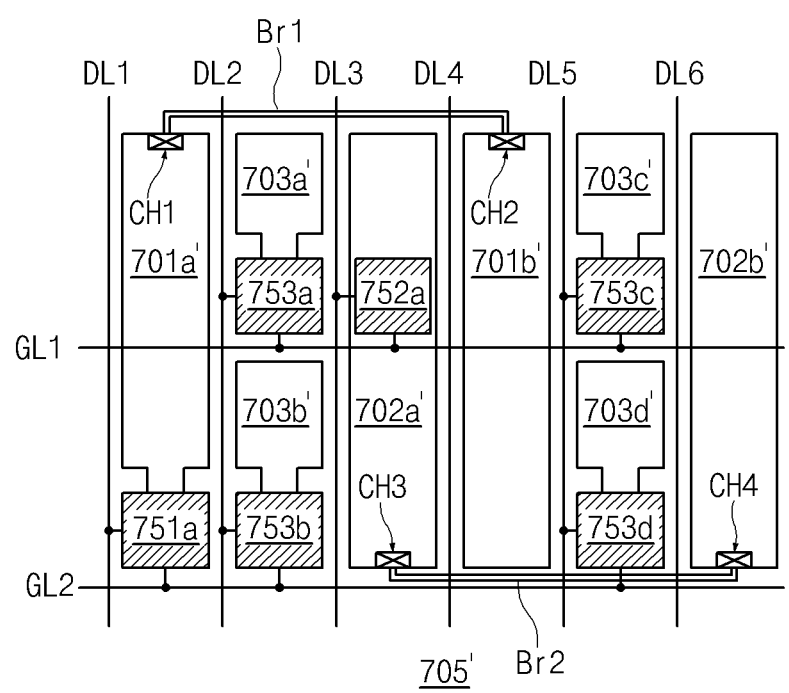
FIG. 16 is a view illustrating a substrate corresponding to the sub-pixel group of FIG. 15.

FIG. 16 is a view illustrating a substrate corresponding to the sub-pixel group of FIG. 15. The display device may be an OLED or an LCD, and includes a substrate 705' corresponding to the sub-pixel group 705 of FIG. 15. The substrate 705' includes first and second gate lines GL1 and GL2, first to sixth data lines DL1 to DL6, first to eighth pixel electrodes 701a', 701b', 702a', 702b', 703a', 703b', 703c', and 703d', and first to sixth driving portions 751a, 752a, 753a, 753b, 753c, and 753d.

The first and second gate lines GL1 and GL2 on the substrate 705' are along a first direction. The first to sixth data lines DL1 to DL6 are along a second direction crossing the first direction.

The first pixel electrode 701a' is located at a region corresponding to the first sub-pixel 701a on a first column, and positioned at the first gate line GL1 and between the first and second data lines DL1 and DL2. The second pixel electrode 701b' is located at a region corresponding to the first sub-pixel 701b on a fourth column, and positioned at the first gate line GL1 and between the fourth and fifth data lines DL4 and DL5. The third pixel electrode 702a' is located at a region corresponding to the second sub-pixel 702a on a third column, and positioned at the first gate line GL1 and between the third and fourth data lines DL3 and DL4. The fourth pixel electrode 702b' is located at a region corresponding to the second sub-pixel 702b on a six column, and positioned at the first gate line GL1 and adjacent to the sixth data line DL6. The fifth to eighth pixel electrodes 703a' to 703d' are located at regions corresponding to the respective third sub-pixels 703a to 703d, the fifth pixel electrode 703a' positioned adjacent to the first gate line GL1 and between the second and third data lines DL2 and DL3, the sixth pixel electrode 703b' positioned between the first and second gate lines GL1 and GL2 (or positioned adjacent to the second gate line GL2) and between the second and third data lines DL2 and DL3, the seventh pixel electrode 703c' positioned adjacent to the first gate line GL1 and between the fifth and sixth data lines DL5 and DL6, the eighth pixel electrode 703d' positioned between the first and second gate lines GL1 and GL2 (or positioned adjacent to the second gate line GL2) and between the fifth and sixth data lines DL5 and DL6.

The first and second pixel electrodes 701a' and 701b' are connected to each other through the first bridge Br1. The third and fourth pixel electrodes 701a' and 701b' are connected to each other through the first bridge Br1

The first bridge Br1 is arranged along an upper side edge of the first and second pixel electrodes 701a' and 701b', and is electrically connected to the first and second pixel electrodes 701a' and 701b' through first and second contact holes CH1 and CH2, respectively. The first and second contact holes CH1 and CH2 are formed on the first and second pixel electrodes 701a' and 701b'.

The second bridge Br2 is arranged along an lower side edge of the third and fourth pixel electrodes 702a' and 702b', and is electrically connected to the third and fourth pixel electrodes 702a' and 702b' through third and fourth contact holes CH3 and CH4, respectively. The third and fourth contact holes CH3 and CH4 are formed on the third and fourth pixel electrodes 702a' and 702b'.

The first driving portion 751a is connected to the second gate line GL2, the first data line DL1 and the first pixel electrode 701a'. The second driving portion 752a is connected to the first gate line GL1, the third data line DL3 and the third pixel electrode 702a'. The third driving portion 753a is connected to the first gate line GL1, the second data line DL2 and the fifth pixel electrode 703a'. The fourth driving portion 753b is connected to the second gate line GL2, the second data line DL2 and the sixth pixel electrode 703b'. The fifth driving portion 753c is connected to the first gate line GL1, the fifth data line DL5 and the seventh pixel electrode 703c'. The sixth driving portion 753d is connected to the second gate line GL2, the fifth data line DL5 and the eighth pixel electrode 703d'.

Alternatively, the second driving portion 752a may be connected to the second gate line GL2, the third data line DL3, and the third pixel electrode 702a'.

The first to sixth driving portions 751a, 752a, and 753a to 753d may each include at least one thin film transistor and at least one capacitor.

Accordingly, compared with the related art sub-pixel array structure 20 (refer to FIG. 2) that achieves a high resolution by increasing the number of each of the first to third sub-pixels 21 to 23 (refer to FIG. 2) by four times, in the embodiments of the present invention a total number of sub-pixels can be reduced, a high resolution can be achieved. In addition, in the embodiments of the present invention a number of driving portions and a number of data lines are reduced thus an aperture ratio can increase and a power consumption can be reduced.

A method of driving the sub-pixel array structure 700 of the seventh embodiment is explained below. The fifth to eighth pixel electrodes 703a' to 703d' corresponding to the respective third sub-pixels 703a to 703d are supplied with first to fourth data signals, respectively. The first and second pixel electrodes 701a' and 701b' corresponding to the first sub-pixel 701a and 701b and connected to each other through the first bridge Br1 are supplied with a first sampling data signal that is an average of four data signals. The third and fourth pixel electrodes 702a' and 702b' corresponding to the second sub-pixel 702a and 702b and connected to each other through the second bridge Br2 are supplied with a second sampling data signal that is an average of four data signals.

In detail, when a first gate signal is supplied to the first gate line GL1, the first data signal is supplied to the fifth pixel electrode 703a' from the second data line DL2 by the third driving portion 753a, the second sampling data signal is supplied to the third and fourth pixel electrodes 702a' and 702b' connected to each other through the second bridge Br2 from the third data line DL3 by the second driving portion 752a, and the third data signal is supplied to the seventh pixel electrode 703c' from the fifth data line DL5 by the fifth driving portion 753c.

Then, when a second gate signal is supplied to the second gate line GL2, the first sampling data signal is supplied to the first and second pixel electrodes 701a' and 701b' connected to each other through the first bridge Br1 from the first data line DL1 by the first driving portion 751a, the second data signal is supplied to the sixth pixel electrode 703b' from the second data line DL2 by the fourth driving portion 753b, and the fourth data signal is supplied to the eighth pixel electrode 703d' from the fifth data line DL5 by the sixth driving portion 753d.

Figure 17:
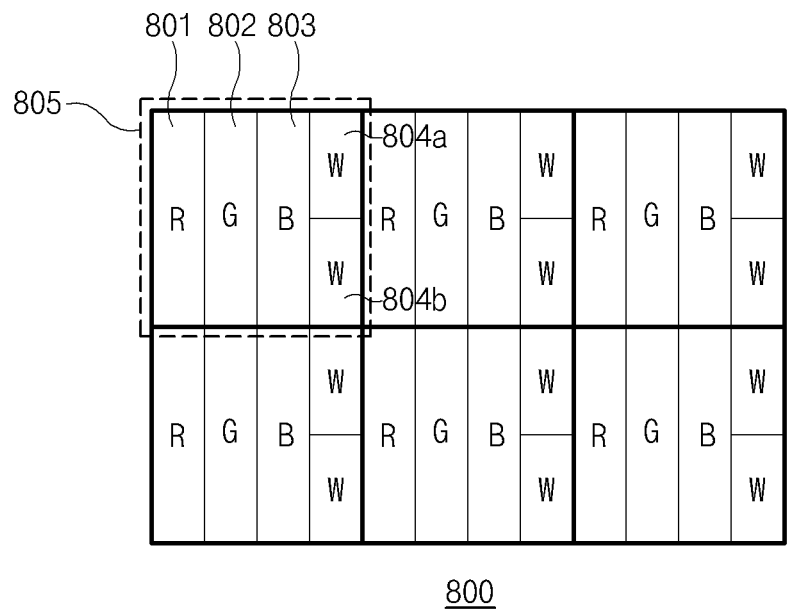
FIG. 17 is a view illustrating a sub-pixel array structure according to an eighth embodiment of the present invention.

FIG. 17 is a view illustrating a sub-pixel array structure according to an eighth embodiment of the present invention. A sub-pixel array structure 800 of the eighth embodiment include a sub-pixel group 805 including first to third sub-pixels 801 to 803 arranged in first to third columns, respectively, and fourth sub-pixels 804a and 804b which are divided in two rows and arranged in a fourth column. Accordingly, a ratio between numbers of the first, second, third, and fourth sub-pixels included in the sub-pixel array structure 800 is 1:1:1:2.

In the sub-pixel group 805 having a predetermined area, an area of the first sub-pixel 801, an area of the second sub-pixel 802, an area of the third sub-pixel 803, and an area of the fourth sub-pixels 804a and 804b may be the same, and an area of each of the fourth sub-pixels 804a and 804b may be a half of the area of each of the first to third sub-pixels 801 to 803.

Further, the first to third sub-pixels 801 to 803 of the sub-pixel group 805 can emit different colors of red (R), green (G) and blue (B) light, for example, red, green and blue lights, respectively. The fourth sub-pixels 804a and 804b of the sub-pixel group 805 can emit green (G) light.

The sub-pixel array structure 800 is a structure including the sub-pixel group 805 arranged repeatedly in each of first and second rows. Accordingly, in the sub-pixel array structure 800 of the eighth embodiment, the number of each of the first to third sub-pixels 801 to 803 emitting red, green and blue light, respectively, is remained, and the number of the fourth sub-pixels 804a and 804b emitting white light improving brightness increases by two times. Accordingly, brightness is adjusted more minutely and clear images can be displayed.

Figure 18:
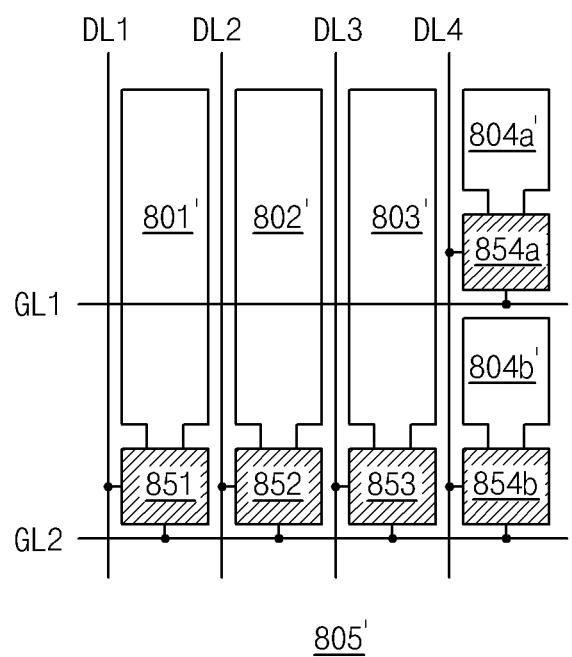
FIG. 18 is a view illustrating a substrate corresponding to the sub-pixel group of FIG. 17.

FIG. 18 is a view illustrating a substrate corresponding to the sub-pixel group of FIG. 17. The display device may be an OLED or an LCD, and includes a substrate 805' corresponding to the sub-pixel group 805 of FIG. 17. Referring to FIG. 18, the substrate 805' includes first and second gate lines GL1 and GL2, first to fourth data lines DL1 to DL4, first to fifth pixel electrodes 801', 802', 803', 804a' and 804b', and first to fifth driving portions 851, 852, 853, 854a and 854b.

The first and second gate lines GL1 and GL2 on the substrate 805' are along a first direction. The first to fourth data lines DL1 to DL4 are along a second direction crossing the first direction.

The first pixel electrode 801' is located at a region corresponding to the first sub-pixel 801 on a first column, and positioned at the first gate line GL1 and between the first and second data lines DL1 and DL2. The second pixel electrode 802' is located at a region corresponding to the second sub-pixel 802 on a second column, and positioned at the first gate line GL1 and between the second and third data lines DL2 and DL3. The third pixel electrode 803' is located at a region corresponding to the third sub-pixel 803 on a third column, and positioned at the first gate line GL1 and between the third and fourth data lines DL3 and DL4. The fourth and fifth pixel electrodes 804a' and 804b' are located at regions corresponding to the respective fourth sub-pixels 804a and 804b, the fourth pixel electrode 804a' positioned adjacent to the first gate line GL1 and adjacent to the fourth data lines DL4, the fifth pixel electrode 804a' positioned between the first and second gate lines GL1 and GL2 (or positioned adjacent to the second gate line GL2) and adjacent to the fourth data line DL4.

The first driving portion 851 is connected to the second gate line GL2, the first data line DL1 and the first pixel electrode 801'. The second driving portion 852 is connected to the second gate line GL2, the second data line DL2 and the second pixel electrode 802'. The third driving portion 853 is connected to the second gate line GL2, the third data line DL3 and the third pixel electrode 803'. The fourth driving portion 854a is connected to the first gate line GL1, the fourth data line DL4 and the fourth pixel electrode 804a'. The fifth driving portion 854b is connected to the second gate line GL2, the fourth data line DL4 and the fifth pixel electrode 804b'.

Alternatively, The first driving portion 851 may be connected to the first gate line GL1, the first data line DL1 and the first pixel electrode 801'. The second driving portion 852 may be connected to the first gate line GL1, the second data line DL2 and the second pixel electrode 802'. The third driving portion 853 may be connected to the first gate line GL1, the third data line DL3 and the third pixel electrode 803'.

The first to fifth driving portions 851 to 853, 854a and 854b may each include at least one thin film transistor and at least one capacitor.

A method of driving the sub-pixel array structure 800 of the eighth embodiment is explained below. The fourth and fifth pixel electrodes 804a' and 804b' corresponding to the respective fourth sub-pixels 804a and 804b are supplied with first and second data signals, respectively. The first to third pixel electrodes 801' to 803' corresponding to the first to third sub-pixels 801 to 803 are supplied with first to third sampling data signals that each are an average of two data signals.

In detail, when a first gate signal is supplied to the first gate line GL1, the first data signal is supplied to the fourth pixel electrode 804a' from the fourth data line DL4 by the fourth driving portion 854a. Then, when a second gate signal is supplied to the second gate line GL2, the first sampling data signal is supplied to the first pixel electrode 801' from the first data line DL1 by the first driving portion 851, the second sampling data signal is supplied to the second pixel electrode 802' from the second data line DL2 by the second driving portion 852, the third sampling data signal is supplied to the third pixel electrode 803' from the third data line DL3 by the third driving portion 853, and the second data signal is supplied to the fifth pixel electrode 804b' from the fourth data line DL4 by the fifth driving portion 854b.

Figure 19:
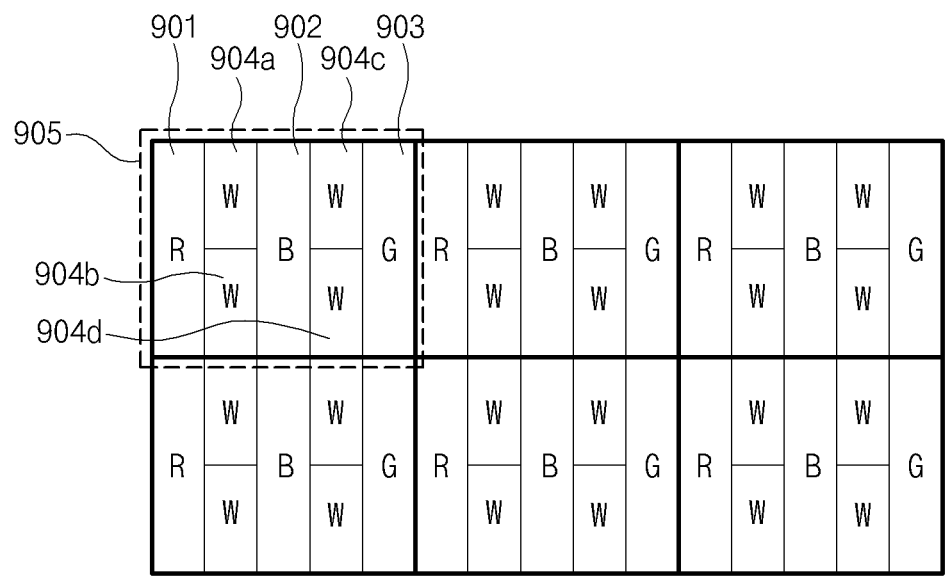
FIG. 19 is a view illustrating a sub-pixel array structure according to a ninth embodiment of the present invention.

FIG. 19 is a view illustrating a sub-pixel array structure according to a ninth embodiment of the present invention. A sub-pixel array structure 900 of the ninth embodiment include a sub-pixel group 905 including first, second and third sub-pixels 901, 902 and 903 arranged in first, third and fifth columns, respectively, and fourth sub-pixels 904a to 904d which are divided in two rows and arranged in second and fourth columns. Accordingly, a ratio between numbers of the first, second, third, and fourth sub-pixels included in the sub-pixel array structure 900 is 1:1:1:4.

In the sub-pixel group 905 having a predetermined area, an area of the first sub-pixel 901, an area of the second sub-pixel 902, an area of the third sub-pixel 903, and an area of the fourth sub-pixels 904a to 904d may be the same, and an area of each of the fourth sub-pixels 904a to 904d may be a quarter of the area of each of the first to third sub-pixels 901 to 903.

Further, the first to third sub-pixels 901 to 903 of the sub-pixel group 905 can emit different colors of red (R), green (G) and blue (B) light, for example, red, blue and green lights, respectively. The fourth sub-pixels 904a to 904d of the sub-pixel group 905 can emit green (G) light. The sub-pixel array structure 900 is a structure including the sub-pixel group 905 arranged repeatedly in each of first and second rows.

Accordingly, in the sub-pixel array structure 900 of the ninth embodiment, the number of each of the first to third sub-pixels 901 to 903 emitting red, blue and green light, respectively, is remained, and the number of the fourth sub-pixels 804a to 804d emitting white light improving brightness increases by four times. Accordingly, brightness is adjusted more minutely and clear images can be displayed.

Figure 20:
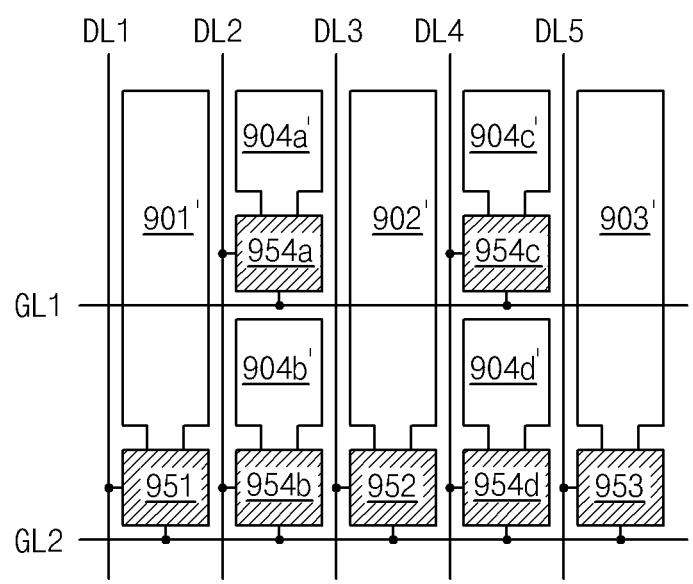
FIG. 20 is a view illustrating a substrate corresponding to the sub-pixel group of FIG. 19.

FIG. 20 is a view illustrating a substrate corresponding to the sub-pixel group of FIG. 19. The display device may be an OLED or an LCD, and includes a substrate 905' corresponding to the sub-pixel group 905 of FIG. 19. The substrate 905' includes first and second gate lines GL1 and GL2, first to fifth data lines DL1 to DL5, first to seventh pixel electrodes 901', 902', 903', and 904a' to 904d', and first to seventh driving portions 951, 952, 953, and 954a to 954d.

The first and second gate lines GL1 and GL2 on the substrate 905' are along a first direction. The first to fifth data lines DL1 to DL5 are along a second direction crossing the first direction.

The first pixel electrode 901' is located at a region corresponding to the first sub-pixel 901 on a first column, and positioned at the first gate line GL1 and between the first and second data lines DL1 and DL2. The second pixel electrode 902' is located at a region corresponding to the second sub-pixel 902 on a third column, and positioned at the first gate line GL1 and between the third and fourth data lines DL3 and DL4. The third pixel electrode 903' is located at a region corresponding to the third sub-pixel 903 on a fifth column, and positioned at the first gate line GL1 and adjacent to the fifth data line DL5. The fourth to seventh pixel electrodes 904a' to 904d' are located at regions corresponding to the respective fourth sub-pixels 904a to 904d, the fourth pixel electrode 904a' positioned adjacent to the first gate line GL1 and between the second and third data lines DL2 and DL3, the fifth pixel electrode 904b' positioned between the first and second gate lines GL1 and GL2 (or positioned adjacent to the second gate line GL2) and between the second and third data lines DL2 and DL3, the sixth pixel electrode 904c' positioned adjacent to the first gate line GL1 and between the fourth and fifth data lines DL4 and DL5, the seventh pixel electrode 904d' positioned between the first and second gate lines GL1 and GL2 (or positioned adjacent to the second gate line GL2) and between the fourth and fifth data lines DL4 and DL5.

The first driving portion 951 is connected to the second gate line GL2, the first data line DL1 and the first pixel electrode 901'. The second driving portion 952 is connected to the second gate line GL2, the third data line DL3 and the second pixel electrode 902'. The third driving portion 953 is connected to the second gate line GL2, the fifth data line DL5 and the third pixel electrode 903'. The fourth driving portion 954a is connected to the first gate line GL1, the second data line DL2 and the fourth pixel electrode 904a'. The fifth driving portion 954b is connected to the second gate line GL2, the second data line DL2 and the fifth pixel electrode 904b'. The sixth driving portion 954c is connected to the first gate line GL1, the fourth data line DL4 and the sixth pixel electrode 904c'. The seventh driving portion 954d is connected to the second gate line GL2, the fourth data line DL4 and the seventh pixel electrode 904d'.

Alternatively, the first driving portion 951 may be connected to the first gate line GL1, the first data line DL1 and the first pixel electrode 901'. The second driving portion 952 may be connected to the first gate line GL1, the third data line DL3 and the second pixel electrode 902'. The third driving portion 953 may be connected to the first gate line GL1, the fifth data line DL3 and the third pixel electrode 903'. The first to seventh driving portions 951 to 953, and 954a to 954d may each include at least one thin film transistor and at least one capacitor.

A method of driving the sub-pixel array structure 900 of the ninth embodiment is explained below. The fourth to seventh pixel electrodes 904a' to 904d' corresponding to the respective fourth sub-pixels 904a to 904d are supplied with first to fourth data signals, respectively. The first to third pixel electrodes 901' to 903' corresponding to the first to third sub-pixels 901 to 903 are supplied with first to third sampling data signals that each are an average of four data signals.

In detail, when a first gate signal is supplied to the first gate line GL1, the first data signal is supplied to the fourth pixel electrode 904a' from the second data line DL2 by the fourth driving portion 954a, and the third data signal is supplied to the sixth pixel electrode 904c' from the fourth data line DL4 by the sixth driving portion 954c.

Then, when a second gate signal is supplied to the second gate line GL2, the first sampling data signal is supplied to the first pixel electrode 901' from the first data line DL1 by the first driving portion 951, the second data signal is supplied to the fifth pixel electrode 904b' from the second data line DL2 by the fifth driving portion 954b, the second sampling data signal is supplied to the second pixel electrode 902' from the third data line DL3 by the second driving portion 952, the fourth data signal is supplied to the seventh pixel electrode 904d' from the fourth data line DL4 by the seventh driving portion 954d, and the third sampling data signal is supplied to the third pixel electrode 903' from the fifth data line DL5 by the third driving portion 953.

It will be apparent to those skilled in the art that various modifications and variations can be made in a display device of the present invention without departing from the sprit or scope of the invention. Thus, it is intended that the present invention covers the modifications and variations of the foregoing description provided they come within the scope of the appended claims and their equivalents.

What is claimed is:

1. A display device comprising:
   a substrate including a plurality of gate lines and a plurality of data lines crossing the plurality of gate lines; and
   a sub-pixel array structure including a sub-pixel group corresponding to the substrate, wherein the sub-pixel group includes:
   a first sub-pixel;
   a second sub-pixel in a column different from the first sub-pixel; and
   third sub-pixels divided in two rows and in two columns with at least one of the first sub-pixel and the second sub-pixel therebetween,
   wherein first sub-pixels are divided in two rows and in first and fourth columns, the second sub-pixel is in a third column, and the third sub-pixels are in second and fifth columns, and
   wherein a ratio between numbers of the first, second and third sub-pixels is 4:1:4.

2. The display device of claim 1, wherein an area of each of the third sub-pixels is the same size.

3. The display device of claim 1, wherein the first sub-pixel and the second sub-pixel emit colors of lights that are different from each other.

4. The display device of claim 1, wherein the second sub-pixel emits blue light, the third sub-pixels emit green light, and the first sub-pixels emit red and white light at a ratio of 1:1.

5. The display device of claim 1, wherein the first sub-pixels emit red light, the second sub-pixel emits blue light, and the third sub-pixels emit green light.

6. The display device of claim 1, further comprising:
   first and second gate lines among the plurality of gate lines disposed in a first direction;
   first to fifth data lines among the plurality of data lines disposed in a second direction crossing the first direction;
   first to fourth pixel electrodes at regions corresponding to the respective first sub-pixels, the first pixel electrode positioned adjacent to the first gate line and between the first and second data lines, the second pixel electrode positioned adjacent to the second gate line and between the first and second data lines, the third pixel electrode positioned adjacent to the first gate line and between the fourth and fifth data lines, the fourth pixel electrode positioned adjacent to the second gate line and between the fourth and fifth data lines;
   a fifth pixel electrode at a region corresponding to the second sub-pixel and positioned at the first gate line and between the third and fourth data lines;
   sixth to ninth pixel electrodes at regions corresponding to the respective third sub-pixels, the sixth pixel electrode positioned adjacent to the first gate line and between the second and third data lines, the seventh pixel electrode positioned adjacent to the second gate line and between the second and third data lines, the eighth pixel electrode positioned adjacent to the first gate line and adjacent to the fifth data line, the ninth pixel electrode positioned adjacent to the second gate line and adjacent to fifth data line; and
   first to ninth driving portions connected to the first to ninth pixel electrodes, respectively.

7. The display device of claim 6, wherein:
   the first driving portion is connected to the first gate line and the first data line,
   the second driving portion is connected to the second gate line and the first data line,
   the third driving portion is connected to the first gate line and the fourth data line,
   the fourth driving portion is connected to the second gate line and the fourth data line,
   the fifth driving portion is connected to the first or second gate line and the third data line,
   the sixth driving portion is connected to the first gate line and the second data line,
   the seventh driving portion is connected to the second gate line and the second data line, the eighth driving portion is connected to the first gate line and the fifth data line, and the ninth driving portion is connected to the second gate line and the fifth data line.

8. The display device of claim 7, wherein:

the first to fourth pixel electrodes are supplied with first to fourth data signals, respectively, the sixth to ninth pixel electrodes are supplied with fifth to eighth data signals, respectively, and the fifth pixel electrode is supplied with a first sampling data signal which is an average of four data signals.

* * * * *